United States Patent
Bower et al.

(10) Patent No.: US 10,522,710 B2
(45) Date of Patent: Dec. 31, 2019

(54) PRINTABLE INORGANIC SEMICONDUCTOR STRUCTURES

(71) Applicant: X-Celeprint Limited, Cork (IE)

(72) Inventors: Christopher Bower, Raleigh, NC (US); Matthew Meitl, Durham, NC (US); David Gomez, Holly Springs, NC (US); Carl Prevatte, Raleigh, NC (US); Salvatore Bonafede, Chapel Hill, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 16/502,387

(22) Filed: Jul. 3, 2019

(65) Prior Publication Data

US 2019/0326470 A1    Oct. 24, 2019

Related U.S. Application Data

(63) Continuation of application No. 16/137,809, filed on Sep. 21, 2018, now Pat. No. 10,396,238, which is a
(Continued)

(51) Int. Cl.
*H01L 31/0256* (2006.01)
*H01L 33/00* (2010.01)
(Continued)

(52) U.S. Cl.
CPC ...... *H01L 33/0079* (2013.01); *H01L 21/6835* (2013.01); *H01L 29/7848* (2013.01);
(Continued)

(58) Field of Classification Search
CPC ... H01L 33/007; H01L 33/0079; H01L 33/20; H01L 29/7848
(Continued)

(56) References Cited

U.S. PATENT DOCUMENTS 5,621,555 A    4/1997 Park
5,815,303 A    9/1998 Berlin
(Continued)

FOREIGN PATENT DOCUMENTS

DE    10 2009 030 458 A1    12/2010
JP    2011066130 A    3/2011
(Continued)

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.
(Continued)

*Primary Examiner* — David S Blum
(74) *Attorney, Agent, or Firm* — William R. Haulbrook; Michael D. Schmitt; Choate, Hall & Stewart LLP

(57) ABSTRACT

The present invention provides structures and methods that enable the construction of micro-LED chiplets formed on a sapphire substrate that can be micro-transfer printed. Such printed structures enable low-cost, high-performance arrays of electrically connected micro-LEDs useful, for example, in display systems. Furthermore, in an embodiment, the electrical contacts for printed LEDs are electrically interconnected in a single set of process steps. In certain embodiments, formation of the printable micro devices begins while the semiconductor structure remains on a substrate. After partially forming the printable micro devices, a handle substrate is attached to the system opposite the substrate such that the system is secured to the handle substrate. The substrate may then be removed and formation of the semiconductor structures is completed. Upon completion, the printable micro devices may be micro transfer printed to a destination substrate.

20 Claims, 34 Drawing Sheets

Related U.S. Application Data continuation of application No. 15/705,785, filed on Sep. 15, 2017, now Pat. No. 10,109,764, which is a continuation of application No. 15/476,703, filed on Mar. 31, 2017, now Pat. No. 9,799,794, which is a continuation of application No. 14/713,877, filed on May 15, 2015, now Pat. No. 9,640,715.

(51) Int. Cl.

| | | |
|---|---|---|
| *H01L 33/32* | (2010.01) | |
| *H01L 33/62* | (2010.01) | |
| *H01L 33/44* | (2010.01) | |
| *H01L 33/36* | (2010.01) | |
| *H01L 33/38* | (2010.01) | |
| *H01L 29/78* | (2006.01) | |
| *H01L 33/26* | (2010.01) | |
| *H01L 33/40* | (2010.01) | |
| *H01L 21/683* | (2006.01) | |
| *H01L 33/20* | (2010.01) | |

(52) U.S. Cl.
CPC ........ *H01L 33/007* (2013.01); *H01L 33/0095* (2013.01); *H01L 33/20* (2013.01); *H01L 33/26* (2013.01); *H01L 33/32* (2013.01); *H01L 33/36* (2013.01); *H01L 33/38* (2013.01); *H01L 33/40* (2013.01); *H01L 33/44* (2013.01); *H01L 33/62* (2013.01); *H01L 2221/6835* (2013.01); *H01L 2221/68318* (2013.01); *H01L 2221/68322* (2013.01); *H01L 2221/68381* (2013.01); *H01L 2933/0016* (2013.01); *H01L 2933/0025* (2013.01); *H01L 2933/0033* (2013.01)

(58) Field of Classification Search
USPC ..................................................... 257/76, 98
See application file for complete search history.

(56) References Cited

U.S. PATENT DOCUMENTS

| | | | |
|---|---|---|---|
| 6,142,358 | A | 11/2000 | Cohn et al. |
| 6,278,242 | B1 | 8/2001 | Cok et al. |
| 6,287,940 | B1 | 9/2001 | Cole et al. |
| 6,577,367 | B2 | 6/2003 | Kim |
| 6,717,560 | B2 | 4/2004 | Cok et al. |
| 6,756,576 | B1 | 6/2004 | McElroy et al. |
| 6,933,532 | B2 | 8/2005 | Arnold et al. |
| 6,953,977 | B2 | 10/2005 | Mlcak et al. |
| 7,129,457 | B2 | 10/2006 | McElroy et al. |
| 7,195,733 | B2 | 3/2007 | Rogers et al. |
| 7,288,753 | B2 | 10/2007 | Cok |
| 7,354,801 | B2 | 4/2008 | Sugiyama et al. |
| 7,521,292 | B2 | 4/2009 | Rogers et al. |
| 7,557,367 | B2 | 7/2009 | Rogers et al. |
| 7,586,497 | B2 | 9/2009 | Boroson et al. |
| 7,622,367 | B1 | 11/2009 | Nuzzo et al. |
| 7,662,545 | B2 | 2/2010 | Nuzzo et al. |
| 7,704,684 | B2 | 4/2010 | Rogers et al. |
| 7,799,699 | B2 | 9/2010 | Nuzzo et al. |
| 7,816,856 | B2 | 10/2010 | Cok et al. |
| 7,893,612 | B2 | 2/2011 | Cok |
| 7,927,976 | B2 | 4/2011 | Menard |
| 7,932,123 | B2 | 4/2011 | Rogers et al. |
| 7,943,491 | B2 | 5/2011 | Nuzzo et al. |
| 7,972,875 | B2 | 7/2011 | Rogers et al. |
| 7,982,296 | B2 | 7/2011 | Nuzzo et al. |
| 7,999,454 | B2 | 8/2011 | Winters et al. |
| 8,029,139 | B2 | 10/2011 | Ellinger et al. |
| 8,039,847 | B2 | 10/2011 | Nuzzo et al. |
| 8,198,621 | B2 | 6/2012 | Rogers et al. |
| 8,207,547 | B2 | 6/2012 | Lin |
| 8,261,660 | B2 | 9/2012 | Menard |
| 8,334,545 | B2 | 12/2012 | Levermore et al. |
| 8,394,706 | B2 | 3/2013 | Nuzzo et al. |
| 8,440,546 | B2 | 5/2013 | Nuzzo et al. |
| 8,470,701 | B2 | 6/2013 | Rogers et al. |
| 8,502,192 | B2 | 8/2013 | Kwak et al. |
| 8,506,867 | B2 | 8/2013 | Menard |
| 8,558,243 | B2 | 10/2013 | Bibl et al. |
| 8,664,699 | B2 | 3/2014 | Nuzzo et al. |
| 8,686,447 | B2 | 4/2014 | Tomoda et al. |
| 8,722,458 | B2 | 5/2014 | Rogers et al. |
| 8,754,396 | B2 | 6/2014 | Rogers et al. |
| 8,766,970 | B2 | 7/2014 | Chien et al. |
| 8,791,474 | B1 | 7/2014 | Bibl et al. |
| 8,794,501 | B2 | 8/2014 | Bibl et al. |
| 8,803,857 | B2 | 8/2014 | Cok |
| 8,817,369 | B2 | 8/2014 | Daiku |
| 8,835,940 | B2 | 9/2014 | Hu et al. |
| 8,854,294 | B2 | 10/2014 | Sakariya |
| 8,877,648 | B2 | 11/2014 | Bower et al. |
| 8,889,485 | B2 | 11/2014 | Bower |
| 8,895,406 | B2 | 11/2014 | Rogers et al. |
| 8,987,765 | B2 | 3/2015 | Bibl et al. |
| 9,153,171 | B2 | 10/2015 | Sakariya et al. |
| 9,161,448 | B2 | 10/2015 | Menard et al. |
| 9,178,123 | B2 | 11/2015 | Sakariya et al. |
| 9,209,348 | B2 | 12/2015 | Hu et al. |
| 9,358,775 | B2 | 6/2016 | Bower et al. |
| 9,368,683 | B1 | 6/2016 | Meitl et al. |
| 9,370,864 | B2 | 6/2016 | Bibl et al. |
| 9,478,583 | B2 | 10/2016 | Hu et al. |
| 9,484,504 | B2 | 11/2016 | Bibl et al. |
| 9,520,537 | B2 | 12/2016 | Bower et al. |
| 9,555,644 | B2 | 1/2017 | Rogers et al. |
| 9,601,356 | B2 | 3/2017 | Bower et al. |
| 9,620,695 | B2 | 4/2017 | Hu et al. |
| 9,640,715 | B2 | 5/2017 | Bower et al. |
| 9,716,082 | B2 | 7/2017 | Bower et al. |
| 9,761,754 | B2 | 9/2017 | Bower et al. |
| 9,765,934 | B2 | 9/2017 | Rogers et al. |
| 9,799,794 | B2 | 10/2017 | Bower et al. |
| 9,865,832 | B2 | 1/2018 | Bibl et al. |
| 9,929,053 | B2 | 3/2018 | Bower et al. |
| 10,074,768 | B2 | 9/2018 | Meitl et al. |
| 10,109,764 | B2 | 10/2018 | Bower et al. |
| 2006/0063309 | A1 | 3/2006 | Sugiyama et al. |
| 2006/0163594 | A1 | 7/2006 | Kuzmik |
| 2010/0078656 | A1 | 4/2010 | Seo et al. |
| 2010/0248484 | A1 | 9/2010 | Bower et al. |
| 2010/0317132 | A1 | 12/2010 | Rogers et al. |
| 2012/0228669 | A1 | 9/2012 | Bower et al. |
| 2012/0314388 | A1 | 12/2012 | Bower et al. |
| 2013/0069275 | A1 | 3/2013 | Menard et al. |
| 2013/0088416 | A1 | 4/2013 | Smith et al. |
| 2013/0196474 | A1 | 8/2013 | Meitl et al. |
| 2013/0207964 | A1 | 8/2013 | Fleck et al. |
| 2013/0221355 | A1 | 8/2013 | Bower et al. |
| 2013/0273695 | A1 | 10/2013 | Menard et al. |
| 2014/0084240 | A1 | 3/2014 | Hu et al. |
| 2014/0084482 | A1 | 3/2014 | Hu et al. |
| 2014/0104243 | A1 | 4/2014 | Sakariya et al. |
| 2014/0113404 | A1 | 4/2014 | Rossini |
| 2014/0159043 | A1 | 6/2014 | Sakariya et al. |
| 2014/0159065 | A1 | 6/2014 | Hu et al. |
| 2014/0159066 | A1 | 6/2014 | Hu et al. |
| 2014/0264763 | A1 | 9/2014 | Meitl et al. |
| 2014/0267683 | A1 | 9/2014 | Bibl et al. |
| 2014/0340900 | A1 | 11/2014 | Bathurst et al. |
| 2014/0363928 | A1 | 12/2014 | Hu et al. |
| 2014/0367633 | A1 | 12/2014 | Bibl et al. |
| 2015/0135525 | A1 | 5/2015 | Bower |
| 2015/0137153 | A1 | 5/2015 | Bibl et al. |
| 2015/0169011 | A1 | 6/2015 | Bibl et al. |
| 2015/0263066 | A1 | 9/2015 | Hu et al. |
| 2015/0372187 | A1 | 12/2015 | Bower et al. |
| 2016/0093600 | A1 | 3/2016 | Bower et al. |
| 2016/0336488 | A1 | 11/2016 | Bower et al. |
| 2017/0025563 | A1 | 1/2017 | Meitl et al. |
| 2017/0206845 | A1 | 7/2017 | Sakariya et al. |
| 2017/0207364 | A1 | 7/2017 | Bower et al. |
| 2017/0338374 | A1 | 11/2017 | Zou et al. |

(56) References Cited

U.S. PATENT DOCUMENTS

2017/0358703 A1 12/2017 Bower et al.
2018/0006186 A1 1/2018 Bower et al.
2018/0254376 A1 9/2018 Bower et al.

FOREIGN PATENT DOCUMENTS

| TW | 201113940 A | 4/2011 |
|----|----|----|
| WO | WO-2008/103931 A2 | 8/2008 |
| WO | WO-2010/111601 A2 | 9/2010 |
| WO | WO-2015/193436 A1 | 12/2015 |
| WO | WO-2016/184769 A1 | 11/2016 |

OTHER PUBLICATIONS

Cok, R. S. et al., 60.3: AMOLED Displays Using Transfer-Printed Integrated Circuits, Society for Information Display, 10:902-904, (2010).
Cok, R. S. et al., AMOLED displays with transfer-printed integrated circuits, Journal of SID, 19(4):335-341 (2011).
Cok, R. S. et al., Inorganic light-emitting diode displays using micro-transfer printing, Journal of the SID, 25(10):589-609, (2017).
Delmdahl, R. et al., Large-area laser-lift-off processing in microelectronics, Physics Procedia 41:241-248 (2013).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
International Search Report, PCT/EP2016/060641, dated Jul. 25, 2016, 4 pages.
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructural elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Lee, S. H. etal, Laser Lift-Offof GaN Thin Film and its Application to the Flexible Light Emitting Diodes, Proc. of SPIE, 8460:846011-1-846011-6 (2012).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Roscher, H., VCSEL Arrays with Redundant Pixel Designs for 10Gbits/s 2-D Space-Parallel MMF Transmission, Annual Report, optoelectronics Department, (2005).
Trindade, A.J. et al., Precision transfer printing of ultra-thin AlInGaN micron-size light-emitting diodes, Crown, pp. 217-218, (2012).
Written Opinion, PCT/EP2016/060641, dated Jul. 25, 2016, 8 pages.
Yaniv et al., A 640 x 480 Pixel Computer Display Using Pin Diodes with Device Redundancy, 1988 International Display Research Conference, IEEE, CH-2678-1/88:152-154 (1988).

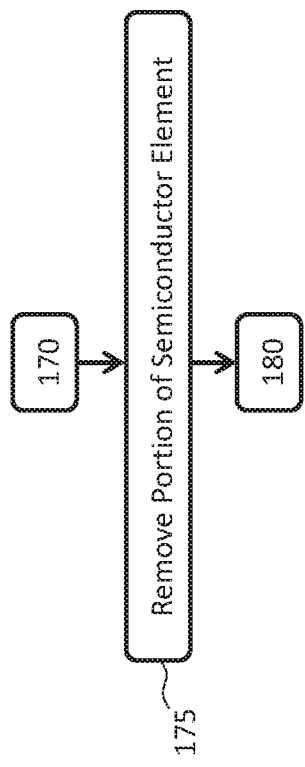
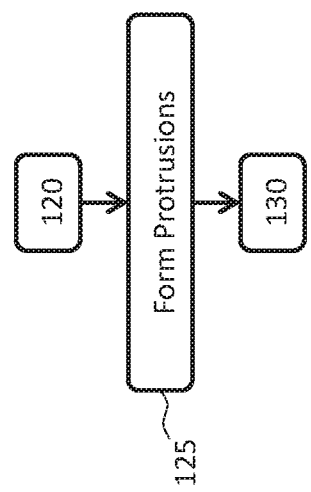
FIG. 23
FIG. 24

PRINTABLE INORGANIC SEMICONDUCTOR STRUCTURES

PRIORITY APPLICATIONS

This application is a continuation of U.S. patent application Ser. No. 16/137,809, filed Sep. 21, 2018, entitled "Printable Inorganic Semiconductor Structures", now U.S. Pat. No. 10,396,238, which is a continuation of U.S. patent application Ser. No. 15/705,785, filed Sep. 15, 2017, entitled "Printable Inorganic Semiconductor Structures", now U.S. Pat. No. 10,109,764, which is a continuation of U.S. patent application Ser. No. 15/476,603, filed Mar. 31, 2017, entitled "Printable Inorganic Semiconductor Structures", now U.S. Pat. No. 9,799,794, which is a continuation of U.S. patent application Ser. No. 14/713,877, filed May 15, 2015, entitled "Printable Inorganic Semiconductor Structures", now U.S. Pat. No. 9,640,715, the content of each of which is hereby incorporated by reference in its entirety.

FIELD OF THE INVENTION

The present invention relates to structures and methods for providing micro-light-emitting diodes on sapphire substrates that can be printed using massively parallel micro-transfer printing methods.

BACKGROUND OF THE INVENTION

Light-emitting diodes (LEDs) are widely used in the display industry as indicators and in small textual or graphic displays. More recently, LEDs are used in large, tiled outdoor displays and have been demonstrated for indoor applications. However, such displays are expensive to make, in part because of the need for small LEDs and the cost of locating small LEDs on a display substrate.

LEDs are formed in a semiconductor material, often using gallium nitride (GaN). These materials are deposited, with suitable doping, on a wafer substrate to form a crystalline structure that is the LED. Electrical contacts are then formed using photolithographic methods and the LED device is singulated from the wafer and packaged. Most LEDs are formed on a sapphire wafer rather than a gallium nitride wafer to reduce costs. However, the lattice structure of the sapphire wafer does not match that of the GaN LED crystal and therefore the crystal structure tends to have defects, reducing the performance and acceptability of the resulting LED.

Inorganic light-emitting diode displays using micro-LEDs (for example having an area less than 100 microns square or having an area small enough that it is not visible to an unaided observer of the display at a designed viewing distance) are known. For example, U.S. Pat. No. 8,722,458 teaches transferring light-emitting, light-sensing, or light-collecting semiconductor elements from a wafer substrate to a destination substrate using a patterned elastomer stamp whose spatial pattern matches the location of the semiconductor elements on the wafer substrate.

In micro-transfer printing, the chiplets are typically formed on a silicon substrate using photolithographic processes. The silicon substrate facilitates the formation of tethers between the wafer and the chiplet that are broken during the micro-transfer printing process. Although relatively inexpensive when compared to sapphire, silicon has an even larger lattice mismatch with the GaN crystal structures making up the LEDs than sapphire, further reducing the performance of the resulting LEDs. Thus, it is desirable to form printable structures, such as LEDs, using a sapphire substrate. However, there is no available method for undercutting a chiplet formed on a sapphire substrate to enable release of the chiplet for micro-transfer printing. Further, conventional LEDs are formed with a vertical structure having a first electrical contact on a bottom surface of the LED and a second electrical contact on a top surface of the LED. Although this design is effective for electrically interconnecting LEDs, the interconnections require a first conductive layer formed beneath the LED and a second LED formed above the LED. Each of these conductive layers requires a different set of deposition and processing steps. It can be advantageous to employ fewer processing steps to reduce costs in LED structures.

Thus, there is a need for structures and methods that enable the construction of micro-LED chiplets formed on a sapphire substrate that can be micro-transfer printed. There is also a need for simple and inexpensive methods and structures enabling electrical interconnections for chiplets printed on destination substrates. Furthermore, there is a need methods and structures that allow electrically connecting the electrical contacts of printed structures, such as printed LEDs, using less processing steps than conventional methods.

SUMMARY OF THE INVENTION

The present invention provides structures and methods that enable the construction of micro-devices formed on a sapphire substrate that can be micro-transfer printed. Such printed structures enable low-cost, high-performance arrays of electrically connected micro-devices (e.g., micro-LEDs) useful, for example, in display systems. For example, described herein are micro assembled arrays of micro devices, such as micro-LEDs, that are too small (e.g., micro LEDs with a width, length, height and/or diameter of 0.5 µm to 50 µm; e.g., a width of 1-8 µm, a length of 5-10 µm and a height of 0.5-3 µm), numerous, or fragile to be assembled by conventional means. Rather, these arrays are assembled using micro transfer printing technology. The micro-devices may be prepared on a native substrate and printed to a destination substrate (e.g., plastic, metal, glass, sapphire, transparent materials, or flexible materials), thereby obviating the manufacture of the micro-devices on the destination substrate.

In certain embodiments, formation of the printable micro device begins while the semiconductor structure remains on a substrate, such as a sapphire substrate. After partially forming the printable micro device, a handle substrate is attached to the system opposite the substrate such that the system is secured to the handle substrate. The substrate, such as the sapphire substrate, may then be removed from the system using various techniques, such as laser ablation, grinding, etching, and polishing. After the substrate is removed, formation of the semiconductor structure is completed to form the printable micro device. Upon completion, the printable micro device may be micro transfer printed to a destination substrate, thereby enabling parallel assembly of high performance semiconductor devices (e.g., to form micro LED displays) onto virtually any substrate material, including glass, plastics, metals, other semiconductor materials, or other non-semiconductor materials.

Microstructured stamps (e.g., elastomeric, electrostatic stamps, or hybrid elastomeric/electrostatic stamps) may be used to pick up the disclosed micro devices, transport the micro devices to the destination, and print the micro devices onto a destination substrate. In some embodiments, surface adhesion forces are used to control the selection and printing of these devices onto the destination substrate. This process may be performed in massive parallel. The stamps may be designed to transfer a single device or hundreds to thousands of discrete structures in a single pick-up and print operation. For a discussion of micro transfer printing generally, see U.S. Pat. Nos. 7,622,367 and 8,506,867, each of which is hereby incorporated by reference in its entirety.

Moreover, these micro transfer printing techniques may be used to print semiconductor devices at temperatures compatible with assembly on plastic polymer substrates. In addition, semiconductor materials may be printed onto large areas of substrates thereby enabling continuous, high speed printing of complex integrated electrical circuits over large substrate areas.

Moreover, fully flexible electronic devices with good electronic performance in flexed or deformed device orientations may be provided to enable a wide range of flexible electronic devices. The destination substrate may be flexible, thereby permitting the production of flexible electronic devices. Flexible substrates may be integrated in a large number of configurations, including configurations not possible with brittle silicon based electronic devices. Additionally, plastic substrates, for example, are mechanically rugged and may be used to provide electronic devices that are less susceptible to damage and/or electronic performance degradation caused by mechanical stress. Thus, these materials may be used to fabricate electronic devices by continuous, high speed, printing techniques capable of generating electronic devices over large substrate areas at low cost (e.g., roll to roll manufacturing).

In certain embodiments, the disclosed technology relates generally to advantageous interconnection architectures for micro-devices, such as micro-LEDs, as well as devices assembled with micro-devices, such as displays assembled via micro transfer printing. Typically, micro-devices are formed with terminals on different faces of the device. For example, micro-LEDs are formed with terminals on different faces of the micro-LED. This necessitates the step of depositing a vertical insulator between the terminals, e.g., in the robotic assembly of the LED display. For example, if one terminal is on the bottom and one terminal is on the top, the terminals occupy the same space in the x-y plane and a robust insulator is required.

Vertical LEDs are challenged in electrically isolating the anode and cathode during the process of interconnection. For example, displays that use vertical LED structures require the panel-level formation of vertical electrical insulation between the two terminals of the LEDs. In certain embodiments, the disclosed technology avoids this problem by placing the terminals on the same face of the micro-device, such as a micro-LED. Horizontal separation of contact pads facilitates electrical isolation by dint of the horizontal separation of conductors, thereby bypassing this requirement. Additionally, this allows the connections to the terminals of each micro-device to be formed on a single level, thereby reducing the number of levels in the assembled device and improving placement accuracy.

In certain embodiments, micro-devices are assembled (e.g., via micro transfer printing) onto the insulator and holes are created in the insulator to access conductive wires below the insulator. A single level of interconnections are used to provide contact to the terminals of the micro-devices. Thus, this architecture reduces the number of levels required to form the display.

Fine lithography may be used to minimize the separation distance between the terminals (e.g., a separation distance of 100 nm to 20 microns), thus increasing the size of the micro-device terminals. Minimizing the lateral separation between terminals and the micro-device and maximizing the size of the terminals (within the confines of the dimensions of the micro-device) maximizes the tolerance for registration and lithography errors between the assembled micro-devices and the relatively coarse conductive lines used to interconnect them on the display substrate.

The disclosed technology, in certain embodiments, includes a method of making an inorganic semiconductor structure suitable for micro-transfer printing, including: providing a source substrate; forming a semiconductor layer on the source substrate, wherein the semiconductor layer has a first side and a second side opposite the first side and adjacent to the substrate; forming a first electrical contact on the first side of the semiconductor layer opposite the source substrate; removing a portion of the semiconductor layer surrounding the first electrical contact to form a trench surrounding a semiconductor element made from the semiconductor layer, the semiconductor element having a substrate side in contact with the source substrate and a handle side opposite the substrate side; providing a sacrificial layer covering the first electrical contact and covering at least a portion of the handle side of the semiconductor element and filling a portion of the trench; providing an interlayer over the sacrificial layer, the interlayer having different chemical selectivity than the sacrificial layer, wherein a portion of the interlayer contacts the source substrate at the base of the trench to form an anchor; adhering the interlayer to a handle substrate; removing the source substrate to expose the substrate side of the semiconductor element; forming a second electrical contact on the exposed substrate side of the semiconductor element; optionally forming a tether bridging the exposed substrate side of the semiconductor element to the anchor; and removing the sacrificial layer, thereby forming a printable semiconductor structure partially released from the handle substrate and physically secured to the anchor by the tether.

The disclosed technology, in certain embodiments, includes a method of making an inorganic semiconductor structure suitable for micro-transfer printing, including: providing a source substrate; forming a semiconductor layer on the source substrate, wherein the semiconductor layer has a first side and a second side opposite the first side and adjacent to the substrate; removing a portion of the semiconductor layer to form a trench surrounding a semiconductor element made from the semiconductor layer, the semiconductor element having a substrate side in contact with the source substrate and a handle side opposite the substrate side; providing a sacrificial layer covering the first electrical contact and covering at least a portion of the handle side of the semiconductor element and filling a portion of the trench; providing an interlayer over the sacrificial layer, the interlayer having different chemical selectivity than the sacrificial layer, wherein a portion of the interlayer contacts the source substrate at the base of the trench to form an anchor; adhering the interlayer to a handle substrate; removing the source substrate to expose the substrate side of the semiconductor element; removing a portion of the semiconductor element to form a cantilever extension of the semiconductor element; forming a first electrical contact on the cantilever extension; forming a second electrical contact on the exposed substrate side of the semiconductor element; optionally forming a tether bridging the exposed substrate side of the semiconductor element to the anchor; and removing the sacrificial layer, thereby forming a printable semiconductor structure partially released from the handle substrate.

The disclosed technology, in certain embodiments, includes a method of making an inorganic semiconductor structure suitable for micro-transfer printing, including: providing a source substrate; forming a semiconductor layer on the source substrate, wherein the semiconductor layer has a first side and a second side opposite the first side and adjacent to the substrate; removing a portion of the semiconductor layer to form a cantilever extension; forming a first electrical contact on the semiconductor layer; form a second electrical contact on the cantilever extension; removing a portion of the semiconductor layer surrounding each pair of first and second electrical contact to form a trench surrounding a semiconductor element made from the semiconductor layer, the semiconductor element having a substrate side in contact with the source substrate and a handle side opposite the substrate side; providing a sacrificial layer covering the first and second electrical contacts and covering at least a portion of the handle side of the semiconductor element and filling a portion of the trench; providing an interlayer over the sacrificial layer, the interlayer having different chemical selectivity than the sacrificial layer, wherein a portion of the interlayer contacts the source substrate at the base of the trench to form an anchor; adhering the interlayer to a handle substrate; removing the source substrate to expose the substrate side of the semiconductor element; optionally forming a tether bridging the exposed substrate side of the semiconductor element to the anchor; and removing the sacrificial layer, thereby forming a printable semiconductor structure partially released from the handle substrate and physically secured to the anchor by the tether.

The disclosed technology, in certain embodiments, includes a method of making an array of inorganic semiconductor structures suitable for micro-transfer printing, including: providing a source substrate; forming a semiconductor layer on the source substrate, wherein the semiconductor layer has a first side and a second side opposite the first side and adjacent to the substrate; forming a plurality of first electrical contacts on the first side of the semiconductor layer opposite the source substrate; removing a portion of the semiconductor layer surrounding each of the plurality of first electrical contacts to form a plurality of trenches, each surrounding a semiconductor element of a plurality of semiconductor elements made from the semiconductor layer, each semiconductor element having a substrate side in contact with the source substrate and a handle side opposite the substrate side; providing a sacrificial layer covering the plurality of first electrical contact and covering at least a portion of the handle side of each of the plurality of semiconductor elements and filling a portion of each of the plurality of trenches; providing an interlayer over the sacrificial layer, the interlayer having different chemical selectivity than the sacrificial layer, wherein a portion of the interlayer contacts the source substrate at the base of each of the plurality of trenches to form a plurality of anchors; adhering the interlayer to a handle substrate; removing the source substrate to expose the substrate side of each of the plurality of semiconductor elements; forming a plurality of second electrical contacts, each second electrical contract on the exposed substrate side of one of the semiconductor elements of the plurality of semiconductor elements; optionally forming a plurality of tethers, each tether bridging the exposed substrate side of one of the semiconductor elements of the plurality of semiconductor elements to one of the anchors of the plurality of anchors; and removing the sacrificial layer, thereby forming an array of printable semiconductor structures partially released from the handle substrate and physically secured to a respective anchor by a corresponding tether.

The disclosed technology, in certain embodiments, includes a method of making an array of inorganic semiconductor structures suitable for micro-transfer printing, comprising: providing a source substrate; forming a semiconductor layer on the source substrate, wherein the semiconductor layer has a first side and a second side opposite the first side and adjacent to the substrate; removing a portion of the semiconductor layer to form a plurality of trenches, each trench surrounding a semiconductor element of a plurality of semiconductor elements made from the semiconductor layer, each semiconductor element having a substrate side in contact with the source substrate and a handle side opposite the substrate side; providing a sacrificial layer covering at least a portion of the handle side of each of the plurality of semiconductor elements and filling a portion of each of the plurality of trenches; providing an interlayer over the sacrificial layer, the interlayer having different chemical selectivity than the sacrificial layer, wherein a portion of the interlayer contacts the source substrate at the base of each of the plurality of trenches to form a plurality of anchors; adhering the interlayer to a handle substrate; removing the source substrate to expose the substrate side of each of the plurality semiconductor elements; removing a portion of each of the plurality of semiconductor elements to form a plurality of cantilever extension, each cantilever extension of one of the plurality of semiconductor elements; forming a plurality of first electrical contacts, each on one of the plurality of cantilever extensions; forming a plurality of second electrical contacts, each on the exposed substrate side of one of the plurality of semiconductor elements; optionally forming a plurality of tethers bridging the exposed substrate side of one of the plurality of semiconductor elements to one of the plurality of anchors; and removing the sacrificial layer, thereby forming a printable semiconductor structure partially released from the handle substrate.

The disclosed technology, in certain embodiments, includes a method of making an array of inorganic semiconductor structures suitable for micro-transfer printing, comprising: providing a source substrate; forming a semiconductor layer on the source substrate, wherein the semiconductor layer has a first side and a second side opposite the first side and adjacent to the substrate; removing a portion of the semiconductor layer to form a plurality of cantilever extensions; forming a plurality of first electrical contacts on the semiconductor layer; form a plurality of second electrical contact, each on one of the plurality of cantilever extensions; removing a portion of the semiconductor layer surrounding each pair of first and second electrical contacts to form a plurality of trenches, each surrounding a semiconductor element of a plurality of semiconductor elements made from the semiconductor layer, the plurality of semiconductor elements having a substrate side in contact with the source substrate and a handle side opposite the substrate side; providing a sacrificial layer covering the plurality of first and second electrical contacts and covering at least a portion of the handle side of each of the plurality of semiconductor elements and filling a portion of each of the plurality of trenches; providing an interlayer over the sacrificial layer, the interlayer having different chemical selectivity than the sacrificial layer, wherein a portion of the interlayer contacts the source substrate at the base of each of the plurality of trenches to form a plurality of anchors; adhering the interlayer to a handle substrate; removing the source substrate to expose the substrate side of each of the plurality of semiconductor elements; optionally forming a plurality of tethers, each bridging the exposed substrate side of one of the plurality of semiconductor elements to one of the plurality of anchors; and removing the sacrificial layer, thereby forming a plurality of printable semiconductor structures partially released from the handle substrate and physically secured to a respective anchor by a corresponding tether.

In certain embodiments, the handle substrate is a glass, metal, or plastic. In certain embodiments, the handle substrate is a wafer.

In certain embodiments, the sacrificial layer comprises a material selected from the group consisting of Si (1 1 1), InAlP, InP, GaAs, InGaAs, AlGaAs, GaSb, GaAlSb, AlSb, InSb, InGaAlSbAs, InAlSb, and InGaP.

In certain embodiments, the tether includes a notch, the notch providing a point of fracture for a releasable micro object when retrieved by a transfer element.

In certain embodiments, the tether is a narrow shaped tether (e.g., a width of 10 μm to 40 μm).

In certain embodiments, forming the tether includes: forming a photo-sensitive layer on the exposed substrate side of the semiconductor element and the anchor; selectively exposing portions of the photo-sensitive layer to an energized beam (e.g., electromagnetic-radiation beam or electron beam) to alter solubility of the photo-sensitive layer to a photoresist developer; and selectively removing portions of the photo-sensitive layer (e.g., soluble or insoluble to the photoresist developer) to define the tether comprising portions of the photo-sensitive layer.

In certain embodiments, the source substrate is a sapphire substrate.

In certain embodiments, the semiconductor layer comprises GaN and/or doped GaN.

In certain embodiments, the semiconductor layer comprises multiple sub-layers.

In certain embodiments, adhering the interlayer to a handle substrate comprises providing an adhesive layer on the interlayer and adhering the handle substrate to the adhesion layer.

In certain embodiments, removing the source substrate comprises removing the source substrate using laser ablation.

In certain embodiments, the method includes removing a portion of the semiconductor element to expose a portion of the first electrical contact.

In certain embodiments, the method includes forming protrusions (e.g., metal protrusions) on the first electrical contact.

In certain embodiments, the trench extends through the semiconductor layer to the source substrate.

In certain embodiments, the trench extends partially into the semiconductor layer such that a portion of the semiconductor layer forms an ablation layer between the semiconductor element and the source substrate.

In certain embodiments, the interlayer has a thermal conductivity greater than or equal to 1 W/mK.

In certain embodiments, the semiconductor element, the first electrical contact, and the second electrical contact form a diode, a laser, or a light-emitting diode.

In certain embodiments, the structure includes one or more additional electrical contacts, wherein the semiconductor element, the first electrical contact, and the second electrical contact and the one or more additional electrical contacts form a transistor and integrated circuit.

In certain embodiments, the first electrical contact has a different thickness than the second electrical contact.

In certain embodiments, the first electrical contact and the second electrical contact extend to a common distance from a surface of the semiconductor element.

The disclosed technology, in certain embodiments, includes an inorganic semiconductor structure including: a source substrate; a semiconductor element surrounded by a trench, the semiconductor element having a substrate side in contact with the source substrate and a handle side opposite the substrate side; a first metal contact in electrical contact with the semiconductor element on the handle side; a second metal contact in electrical contact with the semiconductor element on the substrate side; a sacrificial layer covering at least a portion of the semiconductor element and covering the first metal contact and filling a portion of the trench; an interlayer formed over the sacrificial layer, wherein a portion of the interlayer contacts the source substrate at a base of the trench to form an anchor; a handle substrate adhered to the interlayer, wherein at least a portion of the interlayer is between the handle substrate and the sacrificial layer; and a tether bridging the substrate side of the semiconductor element to the anchor.

The disclosed technology, in certain embodiments, includes an inorganic semiconductor structure including: a semiconductor element surrounded by a trench, the semiconductor element having a substrate side and a handle side opposite the substrate side; a first electrical contact on the handle side of the semiconductor element; a second electrical contact on the substrate side of the semiconductor element; a sacrificial layer covering the first electrical contact and covering the handle side of at least a portion of the semiconductor element and filling a portion of the trench; an interlayer formed over the sacrificial layer, wherein a portion of the interlayer contacts the source substrate at a base of the trench to form an anchor; a handle substrate adhered to the interlayer, wherein at least a portion of the interlayer is between the handle substrate and the sacrificial layer; and a tether bridging the substrate side of the semiconductor element to the anchor, thereby physically securing the semiconductor element to the anchor.

The disclosed technology, in certain embodiments, includes a printable inorganic semiconductor structure including: a semiconductor element having a substrate side and a handle side opposite the substrate side; a first electrical contact on the handle side of the semiconductor element; a second electrical contact on the substrate side of the semiconductor element; an interlayer forming an anchor separated from and adjacent to the semiconductor element; a handle substrate adhered to the interlayer; and a tether bridging the substrate side of the semiconductor element to the anchor, thereby physically securing the semiconductor element to the anchor.

In certain embodiments, the handle substrate is a glass, metal, or plastic.

In certain embodiments, the handle substrate is a wafer.

In certain embodiments, the sacrificial layer comprises a material selected from the group consisting of Si (1 1 1), InAlP, InP, GaAs, InGaAs, AlGaAs, GaSb, GaAlSb, AlSb, InSb, InGaAlSbAs, InAlSb, and InGaP.

In certain embodiments, the tether comprises a notch, the notch providing a point of fracture for a releasable micro object when retrieved by a transfer element.

In certain embodiments, the tether is a narrow shaped tether (e.g., a width of 10 μm to 40 μm).

In certain embodiments, the source substrate is a sapphire substrate.

In certain embodiments, the semiconductor layer comprises GaN and/or doped GaN.

In certain embodiments, the semiconductor layer comprises multiple sub-layers.

In certain embodiments, protrusions (e.g., metal protrusions) on the first electrical contact.

In certain embodiments, the trench extends through the semiconductor layer to the source substrate.

In certain embodiments, the trench extends partially into the semiconductor layer such that a portion of the semiconductor layer forms an ablation layer between the semiconductor element and the source substrate.

In certain embodiments, a portion of the interlayer is in contact with a portion of the semiconductor element and forms the tether.

In certain embodiments, the interlayer is adhesive and the handle substrate is adhered directly to the interlayer.

In certain embodiments, the interlayer has a thermal conductivity greater than or equal to 1 W/mK.

In certain embodiments, the semiconductor element, the first electrical contact, and the second electrical contact form a diode, a laser, or a light-emitting diode.

In certain embodiments, the structure including one or more additional electrical contacts, wherein the semiconductor element, the first electrical contact, and the second electrical contact and the one or more additional electrical contacts form a transistor and integrated circuit.

In certain embodiments, the first electrical contact has a different thickness than the second electrical contact.

In certain embodiments, the first electrical contact and the second electrical contact extend to a common distance from a surface of the semiconductor element.

In certain embodiments, a portion of the semiconductor element is removed such that a portion of the first electrical contact is exposed.

In certain embodiments, the semiconductor structure has a width from 1-8 µm.

In certain embodiments, the semiconductor structure has a length from 5-10 µm.

In certain embodiments, the semiconductor structure has a height from 0.5-3 µm.

The disclosed technology, in certain embodiments, includes a wafer including a plurality (e.g., an array of) of the printable semiconductor structures, wherein the interlayer and handle substrate are common to the plurality of the printable semiconductor structures.

The disclosed technology, in certain embodiments, includes an array of inorganic semiconductor structures including: a source substrate; a plurality of semiconductor elements, each surrounded by a trench of a plurality of trenches and having a substrate side in contact with the source substrate and a handle side opposite the substrate side; a plurality of first metal contacts, each first metal contract in electrical contact with one of the semiconductor elements of the plurality of semiconductor elements on the handle side; a plurality of second metal contacts, each second electrical contract in electrical contact with one of the semiconductor elements of the plurality of semiconductor elements on the substrate side; a sacrificial layer covering at least a portion of each of the semiconductor elements and covering the plurality of first metal contacts and filling a portion of the plurality of trenches; an interlayer formed over the sacrificial layer, wherein a portion of the interlayer contacts the source substrate at a base of at least portion of the plurality of trenches to form a plurality of anchors; a handle substrate adhered to the interlayer, wherein at least a portion of the interlayer is between the handle substrate and the sacrificial layer; and a plurality of tethers, each respective tether bridging the substrate side of one of the semiconductor elements of the plurality of semiconductor elements to one of the anchors of the plurality of anchors.

The disclosed technology, in certain embodiments, includes an array of inorganic semiconductor structures including: a plurality of semiconductor elements, each surrounded by a trench of a plurality of trenches and having a substrate side and a handle side opposite the substrate side; a plurality of first electrical contact, each first electrical contract on the handle side of one semiconductor element of the plurality of semiconductor elements; a plurality of second electrical contacts, each second electrical contact on the substrate side of one semiconductor element of the plurality of semiconductor elements; a sacrificial layer covering the first electrical contact and covering the handle side of at least a portion of the plurality of semiconductor elements and filling a portion of the plurality of trenches; an interlayer formed over the sacrificial layer, wherein a portion of the interlayer contacts the source substrate at a base of at least a portion of the plurality of trenches to form an anchor structure comprising a plurality of anchors; a handle substrate adhered to the interlayer, wherein at least a portion of the interlayer is between the handle substrate and the sacrificial layer; and a plurality of tethers, each respective tether bridging the substrate side of one of the semiconductor elements of the plurality of semiconductor elements to one of the anchors of the plurality of anchors, thereby physically securing the plurality of semiconductor elements to the anchor structure.

The disclosed technology, in certain embodiments, includes an array of printable inorganic semiconductor structures including: a plurality of semiconductor elements, each having a substrate side and a handle side opposite the substrate side; a plurality of first electrical contacts, each first electrical contract on the handle side of one of the semiconductor elements of the plurality of semiconductor elements; a plurality of second electrical contacts, each second electrical contact on the substrate side of one of the semiconductor elements of the plurality of semiconductor elements; an interlayer forming an anchor structure separated from and adjacent to the plurality of semiconductor elements, wherein the anchor structure comprises a plurality of anchors; a handle substrate adhered to the interlayer; and a plurality of tethers bridging the substrate side of one of the semiconductor elements of the plurality of semiconductor elements to one of the anchors of the plurality of anchors, thereby physically securing each semiconductor element to the anchor structure.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 22-27 are flow charts illustrating methods in accordance with embodiments of the present invention;

Figure 1:
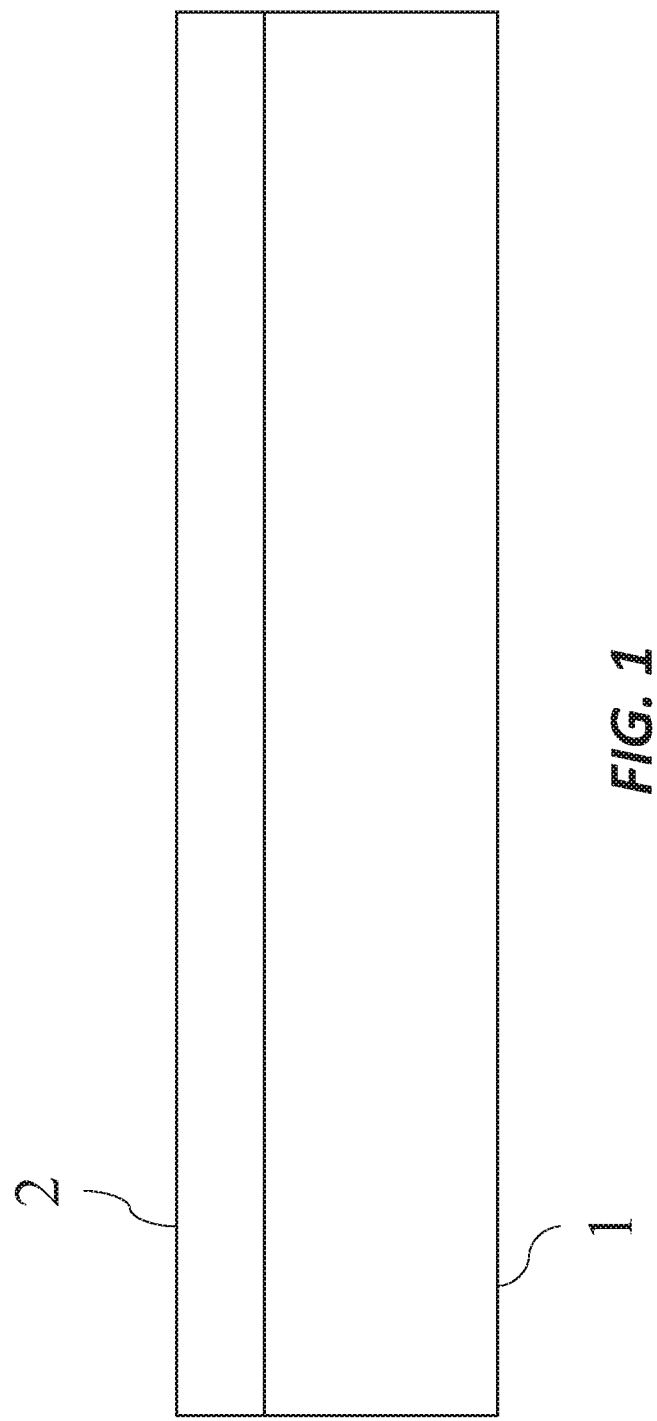
FIGS. 1-10 are cross sections illustrating a method and structures in accordance with embodiments of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides structures and methods that enable the construction of micro-LED chiplets formed on a substrate that can be micro-transfer printed. Such printed structures enable low-cost, high-performance arrays of electrically connected micro-LEDs useful, for example, in display systems. Furthermore, in an embodiment, the electrical contacts for printed LEDs are electrically interconnected in a single set of process steps. Various semiconductor elements may be formed using the methods and techniques described here, including diode (e.g., microdiodes), lasers (micro-lasers), light-emitting diode (e.g., micro-LEDs).

Figure 16:
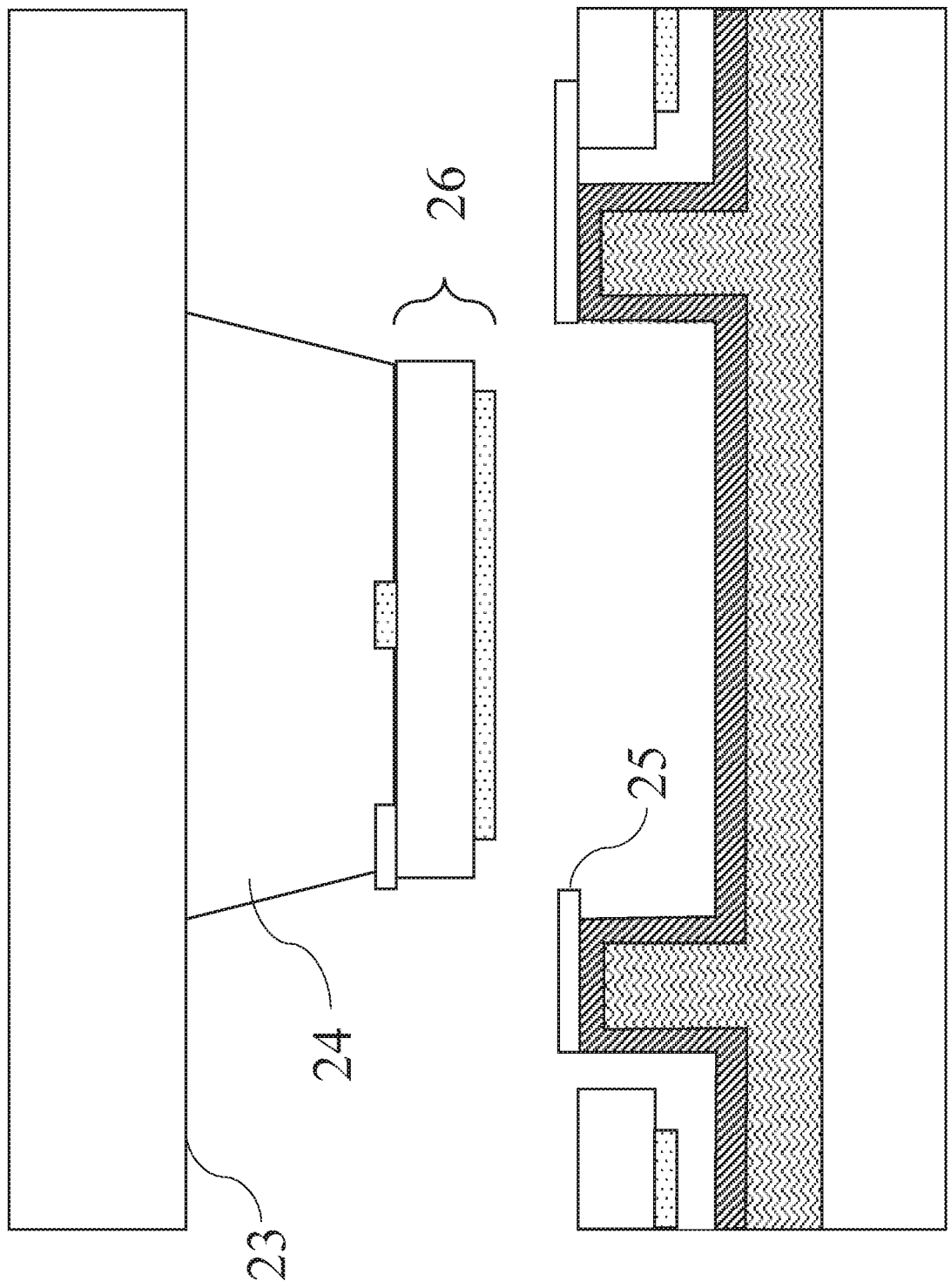
FIGS. 16-18 are sequential cross sections illustrating a method of micro-transfer printing useful in accordance with embodiments of the present invention.
Figure 22:
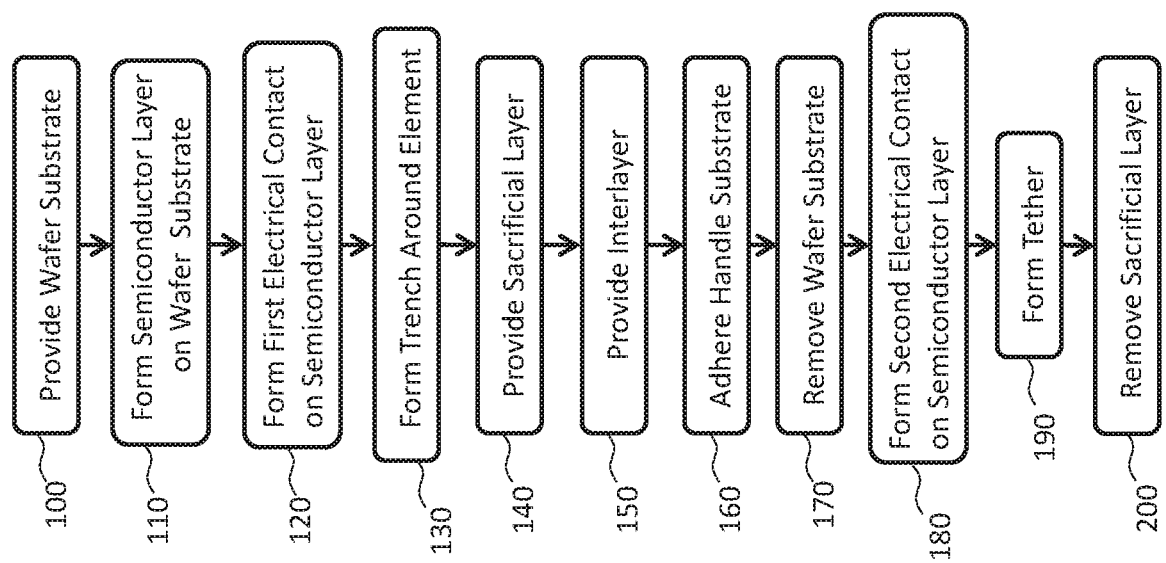

FIGS. 1-10 are diagrams illustrating step-by-step fabrication of a printable semiconductor element 60 secured to an anchor 12 by a tether 10 such that the semiconductor element 60 may be picked up by a transfer device as illustrated in FIG. 16. FIG. 22 is a flowchart illustrating a series of steps (e.g., in sequential order) corresponding to the fabrication of a printable semiconductor element 60 as shown in FIGS. 1-10. Referring to FIGS. 1 and 22, a source substrate 1 is provided in step 100. In some embodiments, the source substrate 1 is a wafer substrate 1, such as a sapphire wafer. Sapphire is a useful substrate because it has a lattice structure more closely matched to that of GaN (useful for LEDs) than silicon. Wafer substrates in a variety of material types and sizes may be used. For the purpose of this description, source substrate 1 will be described as a wafer.

A semiconductor layer 2 is located on the wafer substrate 1 in step 110. The semiconductor layer 2 may be located on the wafer substrate 1, in some embodiments, by forming crystalline layers using molecular beam epitaxy (MBE) or metal organic chemical vapor deposition (MOCVD). The semiconductor layer 2 can be further processed, if necessary, to provide a crystalline semiconductor layer. In some embodiments, the semiconductor layer 2 is crystalline GaN. The GaN material can be doped, for example, with magnesium to form a p-type semiconductor or with silicon or oxygen to form an n-type semiconductor. The semiconductor layer 2 can be formed having sub-layers with different concentrations of different material, for example, to provide different sub-layers having different electrical properties. In some embodiments, one sub-layer is doped to provide increased electrical conductivity and another sub-layer is doped to provide light-emitting properties in response to an electrical current passing through the semiconductor crystal.

Figure 2:
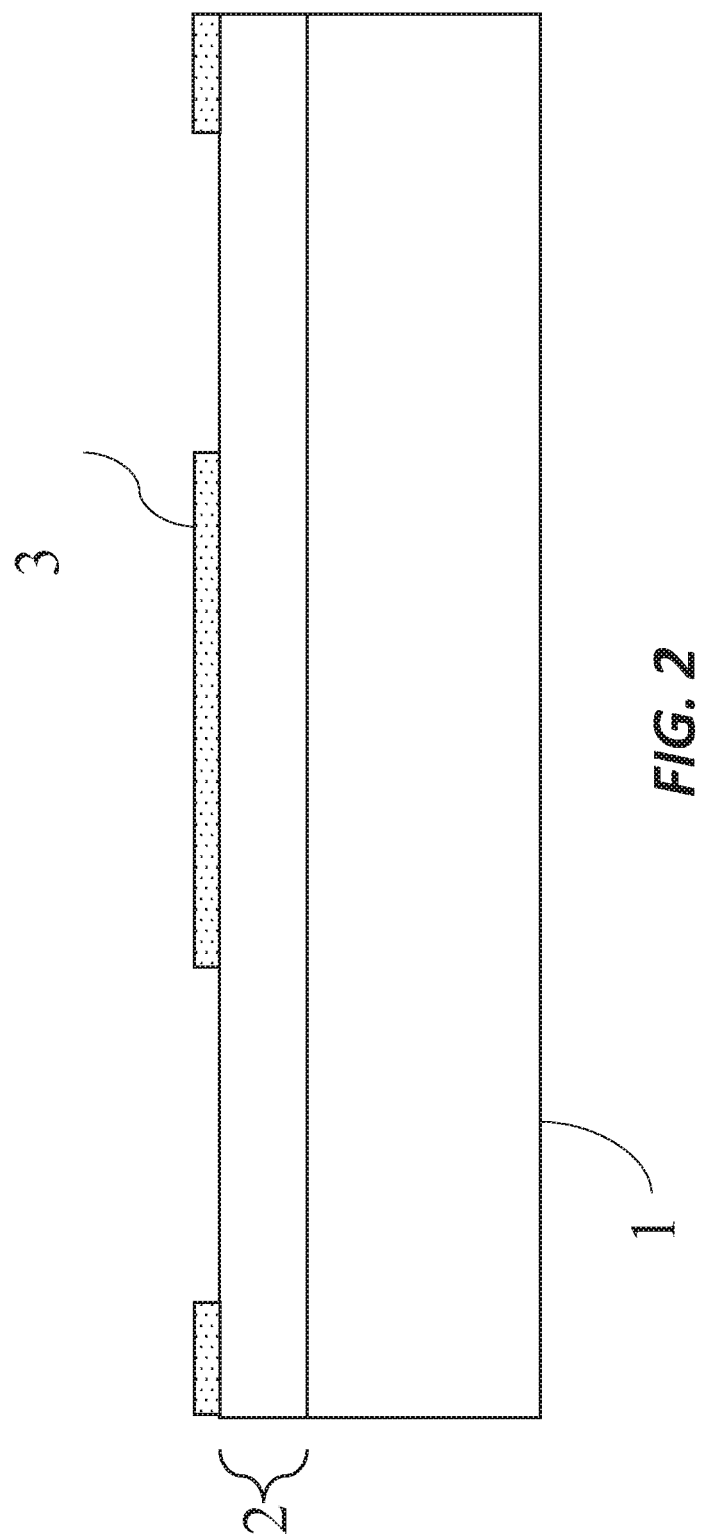

Referring to FIG. 2, an electrically conductive layer is deposited on the semiconductor layer 2 and patterned to form a first electrical contact 3 in step 120. In some embodiments, the first electrical contact 3 is a metal or metal oxides.

Figure 3:
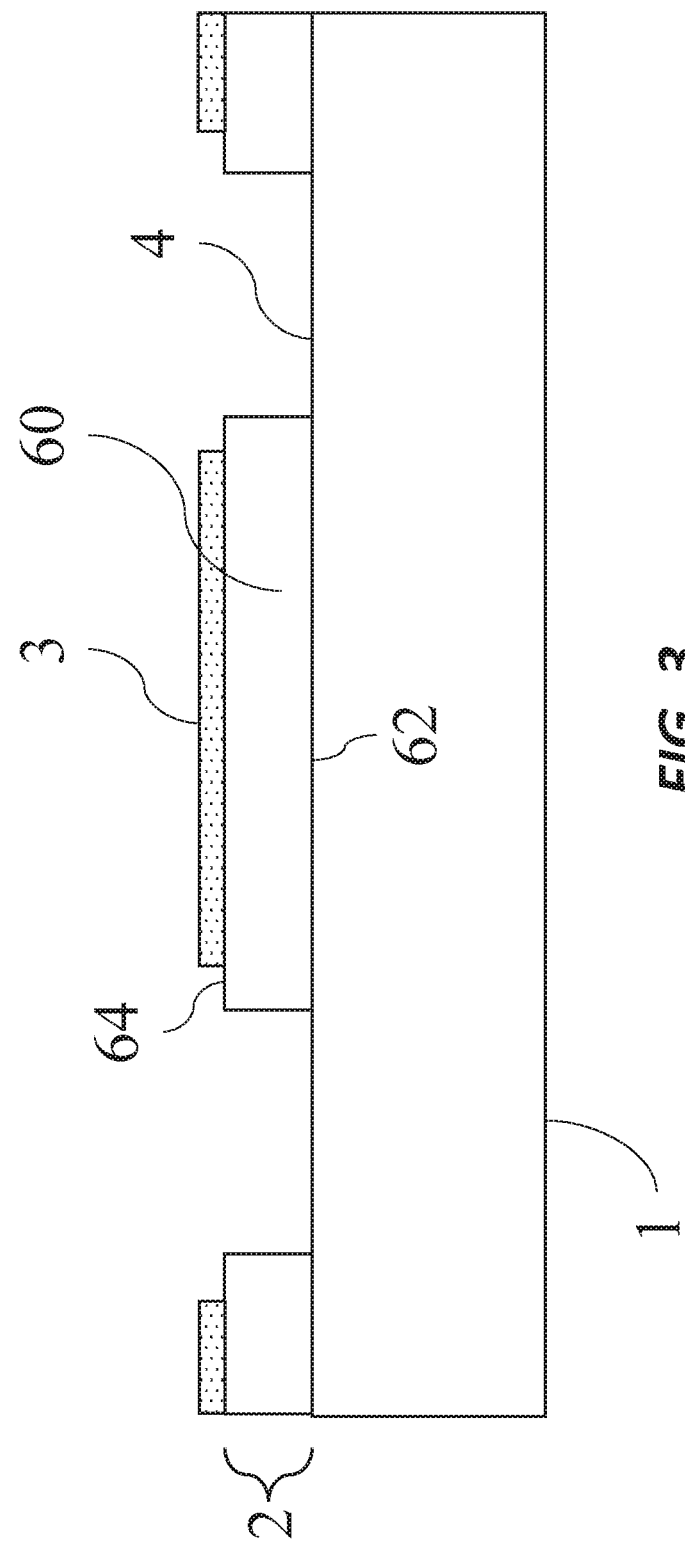

Referring next to FIG. 3, a trench 4 is formed in the semiconductor layer 2 (step 130) thereby forming a semiconductor element 60. In some embodiments, the trench 4 is formed by patterning the semiconductor layer 2, for example, using photolithographic patterning methods (e.g., etching) to form a trench 4 around the semiconductor element 60. The semiconductor element 60 has a substrate side 62 in contact with the wafer substrate 1 and a handle side 64 opposite the substrate side 62. When separated from the larger semiconductor layer 2 and electrically connected with two or more electrical contacts, the semiconductor element 60 can form a variety of semiconductor structures, including a diode, a light-emitting diode (LED), a transistor, or a laser. In some embodiments, the steps illustrated in FIG. 22 are performed in a different order. For example, step 130 may be performed before step 120 such that the trench 4 is formed prior to the first electrical contact 3.

The handle side 64 of the semiconductor element 60 can include all of the surfaces of the semiconductor element 60 other than the substrate side 62 (e.g., that contacts the wafer substrate 1) including the edges and adjacent sides (e.g., not including the substrate side 64). In some embodiments, the handle side 64 only includes the side of the semiconductor element 60 opposite (e.g., and parallel) the wafer substrate 1.

Figure 4:
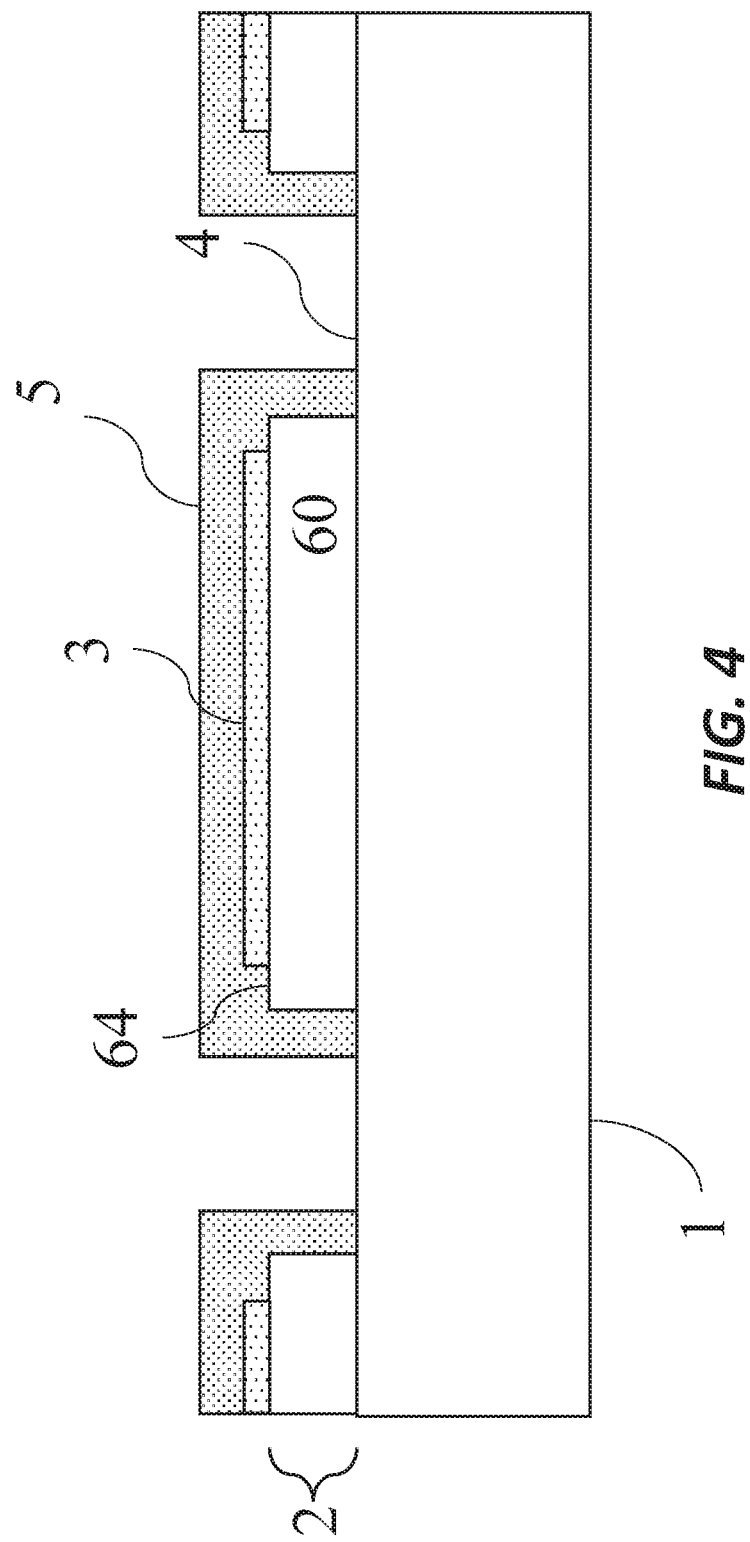

As shown in FIG. 4, a sacrificial layer 5 (step 140) is deposited over the first electrical contact 3. In some embodiments, the sacrificial layer 5 also covers at least a portion of the handle side 64 of the semiconductor element 60 and fills a portion of the trench 4. In one embodiment, the sacrificial layer 5 is formed over the entire handle side 64 of the semiconductor element 60 and over the first electrical contact 3. In another embodiment, the sacrificial layer 5 is formed over the first electrical contact 3 and a portion of the semiconductor element 60, for example, leaving a portion of the semiconductor element 60 exposed, adjacent to, or in contact with the wafer substrate 1. In some embodiments, the sacrificial layer 5 is a polymer, inorganic dielectric, or metals. In some embodiments, the sacrificial layer 5 is Si (1 1 1), InAlP, InP, GaAs, InGaAs, AlGaAs, GaSb, GaAlSb, AlSb, InSb, InGaAlSbAs, InAlSb, or InGaP.

Figure 5:
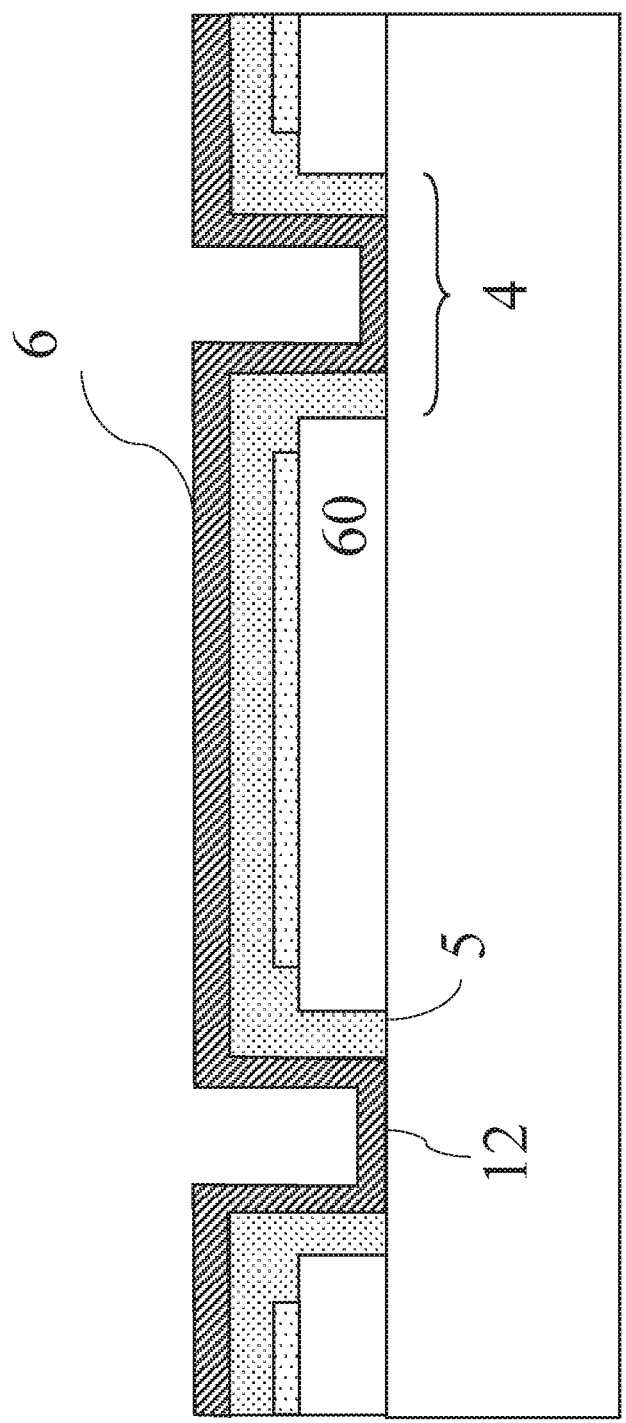

An interlayer 6 is provided in step 150 (FIG. 22) as shown in FIG. 5. The interlayer 6 is located over the sacrificial layer 5 and also fills a portion of the trench 4 to form an anchor 12. The interlayer 6 can be a metal, dielectric, or polymer and has a different chemical selectivity than the sacrificial layer 5. This allows removal of the sacrificial layer 5 without removing the interlayer 6. In this way, the anchor 12 (made of the interlayer 6) will remain in place after the sacrificial layer 5 is moved. As explained below, a tether 10 is formed to connect the semiconductor element 60 to the anchor 12 such that the position and/or orientation of the semiconductor element 60 is maintained after the sacrificial layer 5 is removed. In some embodiments, the sacrificial layer 5 can be etched with chemical solvents such as acids and bases. For example, a basic developer may be used to remove a polymer sacrificial layer. In other embodiments, hydrofluoric acid is used to remove an inorganic oxide sacrificial layer.

Figure 30:
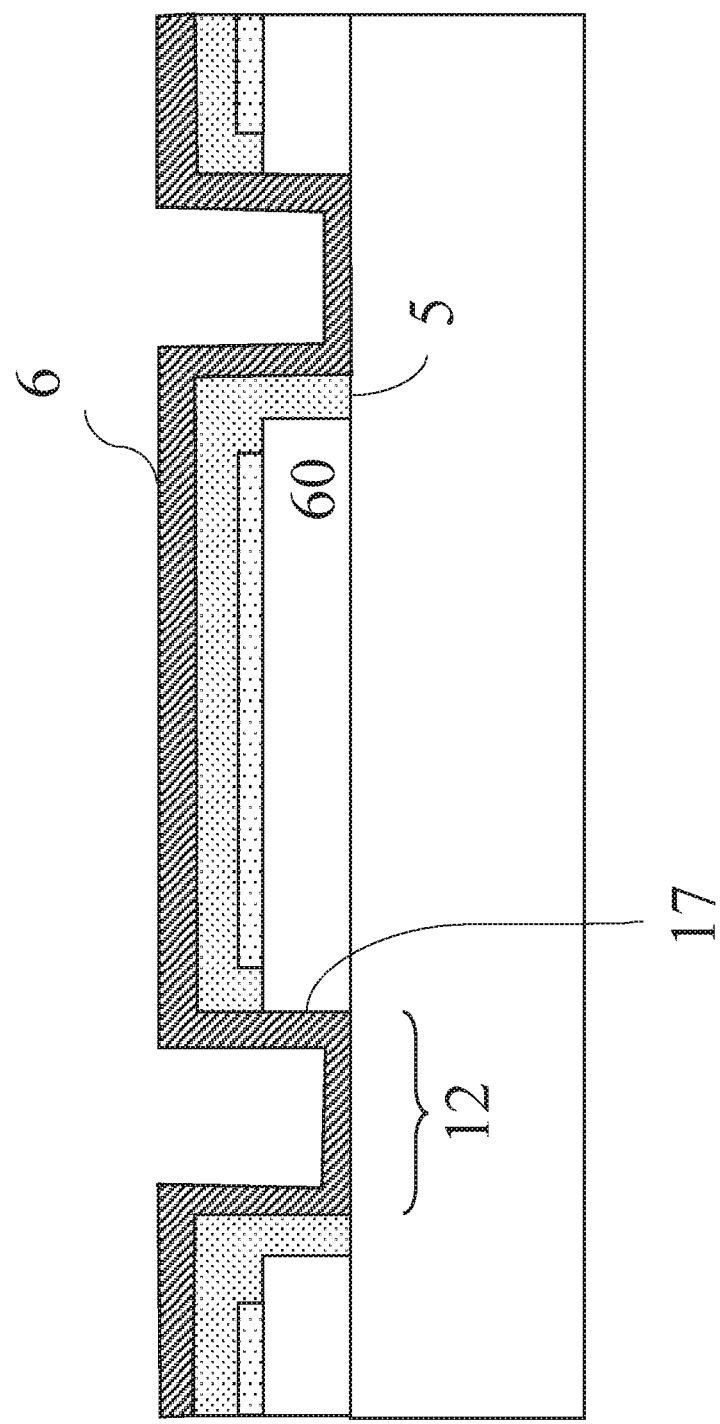
FIGS. 30-31 are cross sections illustrating structures having interlayer tethers in accordance with embodiments of the present invention.

In some embodiments, the interlayer 6 is located in a portion of the trench 4 as shown in FIG. 5. In at least some of the trenches 4 (but not necessarily all), the sacrificial layer 5 is present so that the semiconductor element 60 can be released from the wafer substrate 1 using a printing method. Thus, in one embodiment, the interlayer 6 is present in a portion of all of the trenches 4 because the sacrificial layer 5 is also present in all of the trenches 4. In another embodiment, the sacrificial layer 5 is present in only some, but not all, of the trenches 4, so that the interlayer 6 fills some, but not all, of the trenches. As illustrated in FIG. 30, an interlayer 6 that fills (i.e., coats) an entire trench 4 is also in contact with a portion of the semiconductor element 60 and serves as an interlayer tether 17. In the example shown in FIG. 30, the tether 17 and anchor 12 is formed by the interlayer 6. Thus, when the sacrificial layer 5 is removed, the interlayer 6 (i.e., tether 17) remains connected to the semiconductor element 60 and maintains the position and/or orientation of the semiconductor element 60 until a stamp picks up the semiconductor element 60 (e.g., thereby breaking the tether 17).

Figure 6:
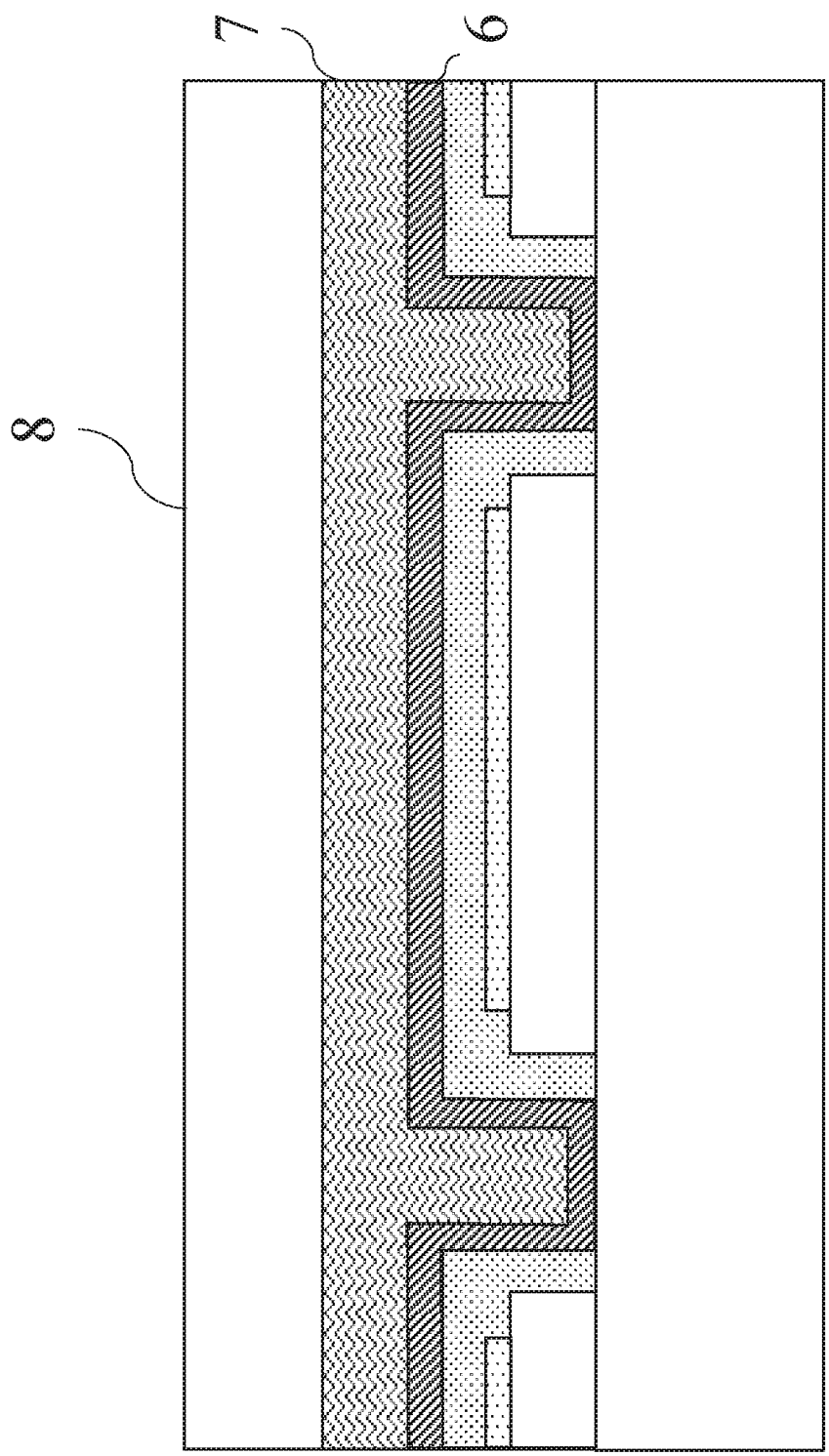

In step 160, the interlayer 6 is adhered to a handle substrate 8 as illustrated in FIG. 6. The handle substrate 8 can be, for example, a glass, metal, or plastic substrate or a wafer. In some embodiments, an adhesive layer 7 is provided on the interlayer 6 and the handle substrate 8 is adhered to the adhesion layer 7. The adhesive layer 7 may be an adhesive material, plastic, resin, or other inorganic materials. The adhesive layer 7 may be provided as a coating over the interlayer 6. The adhesive layer 7 adheres the interlayer 6 to the handle substrate 8. In an alternative embodiment, the interlayer 6 is itself adhesive or the adhesion layer 7 includes the same material as the interlayer 6.

Figure 7:
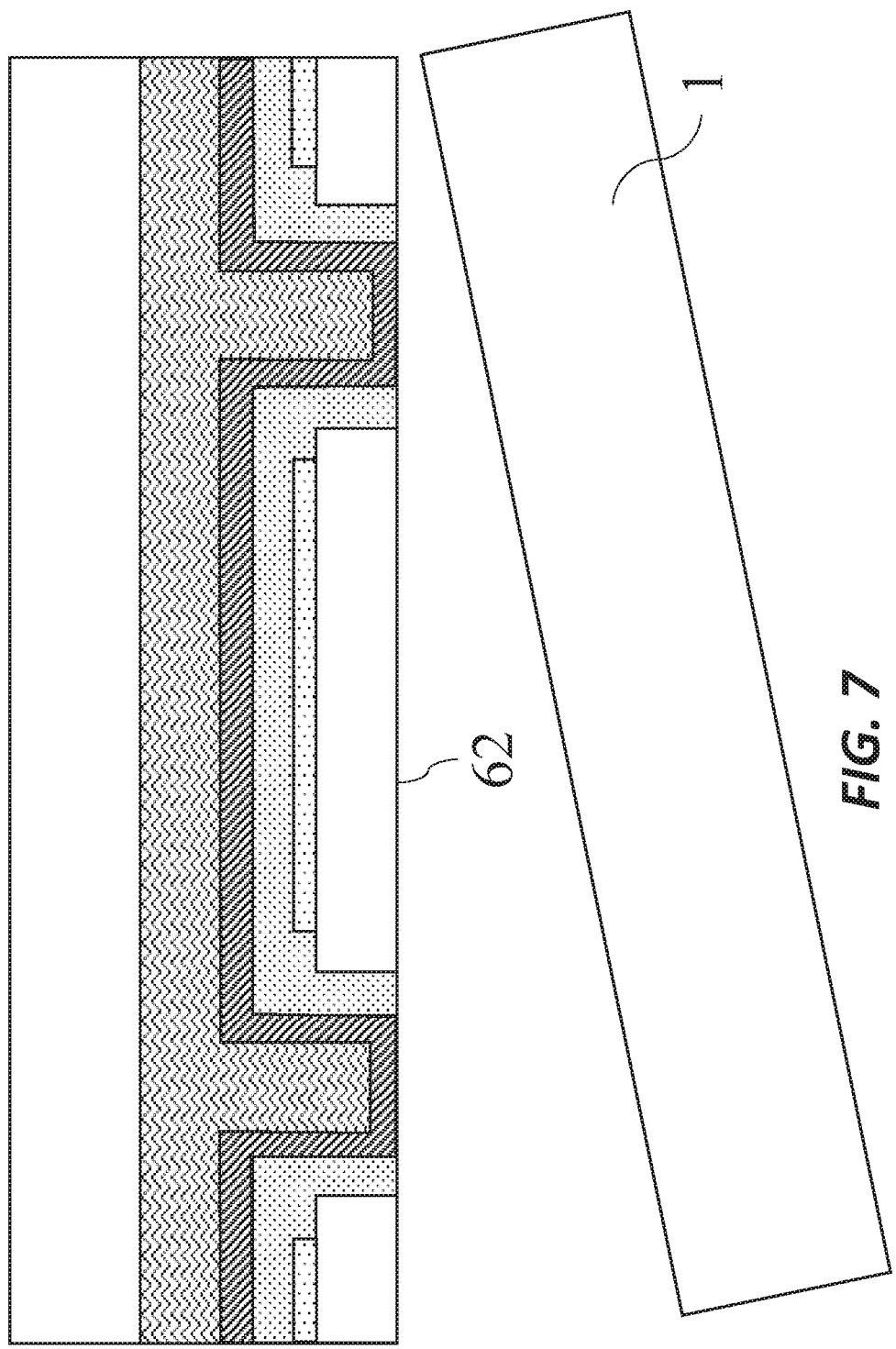
Figure 32:
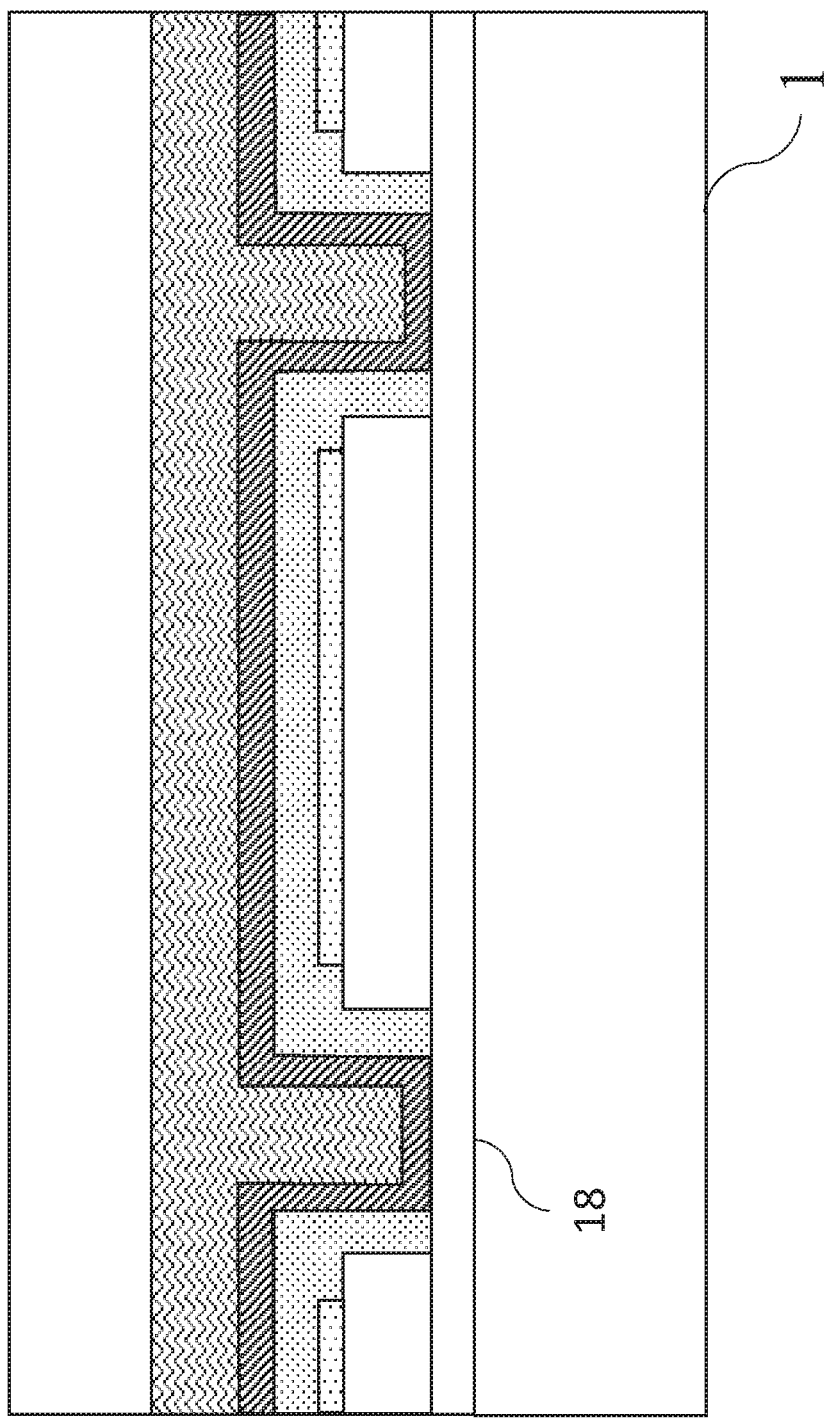
FIG. 32 is a cross section illustrating structures having an ablation layer in accordance with an embodiment of the present invention.

The wafer substrate 1 is then removed (step 170) as shown in FIG. 7 to expose the substrate side 62 of the semiconductor element 60. In some embodiments, the wafer substrate 1 is removed using ablation, for example, laser ablation, grinding, etching, and polishing. In one embodiment, a thin portion of the substrate side 62 of the semiconductor element 60, any portion of the sacrificial layer 5 in contact with the wafer substrate 1 and any portion of the interlayer 6 in contact with the wafer substrate 1 are ablated. In another embodiment a thin laser ablation layer 18 that effectively absorbs laser radiation is provided on the wafer substrate 1 before the semiconductor layer 2 is formed such that the ablation layer 18 is between the semiconductor layer 2 and the wafer substrate 1 as shown in FIG. 32.

Figure 33:
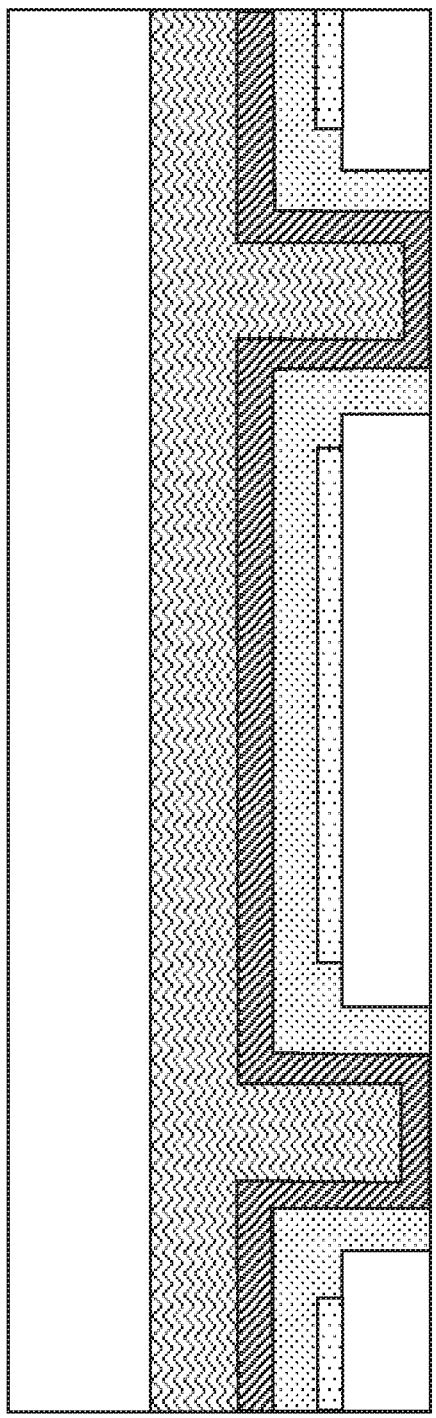
FIG. 33 is a cross section illustrating structures after the removal of an ablation layer and substrate in accordance with an embodiment of the present invention.

In yet another embodiment, a portion of the semiconductor layer 2 serves as an ablation layer. In this embodiment, step 130 of providing a trench 4 in the semiconductor layer 2 removes only a portion of the semiconductor layer 2 in the trench 4. The remaining semiconductor material below the trench 4 and a portion of the semiconductor material making up the semiconductor element 60 (e.g., the bottom portion on the substrate side 62) serves as the ablation layer. A portion of the semiconductor layer 2 on the wafer substrate 1 under the semiconductor element 60 is also designated as the ablation layer even though the same semiconductor materials form both layers. In this embodiment, the semiconductor ablation layer is located between the wafer 1 on one side and both the sacrificial layer 5, the interlayer 6, and semiconductor element 60 on the other. The portion of the ablation layer beneath the semiconductor element 60 is essentially equivalent to the embodiment above in which a thin layer of the semiconductor element 60 is ablated. Once the thin ablatable layer between the wafer substrate 1 and the elements formed over the wafer substrate 1 is ablated, the wafer substrate 1 can be removed by mechanical means, by washing, or by other methods resulting in the structure of FIG. 33.

Figure 8:
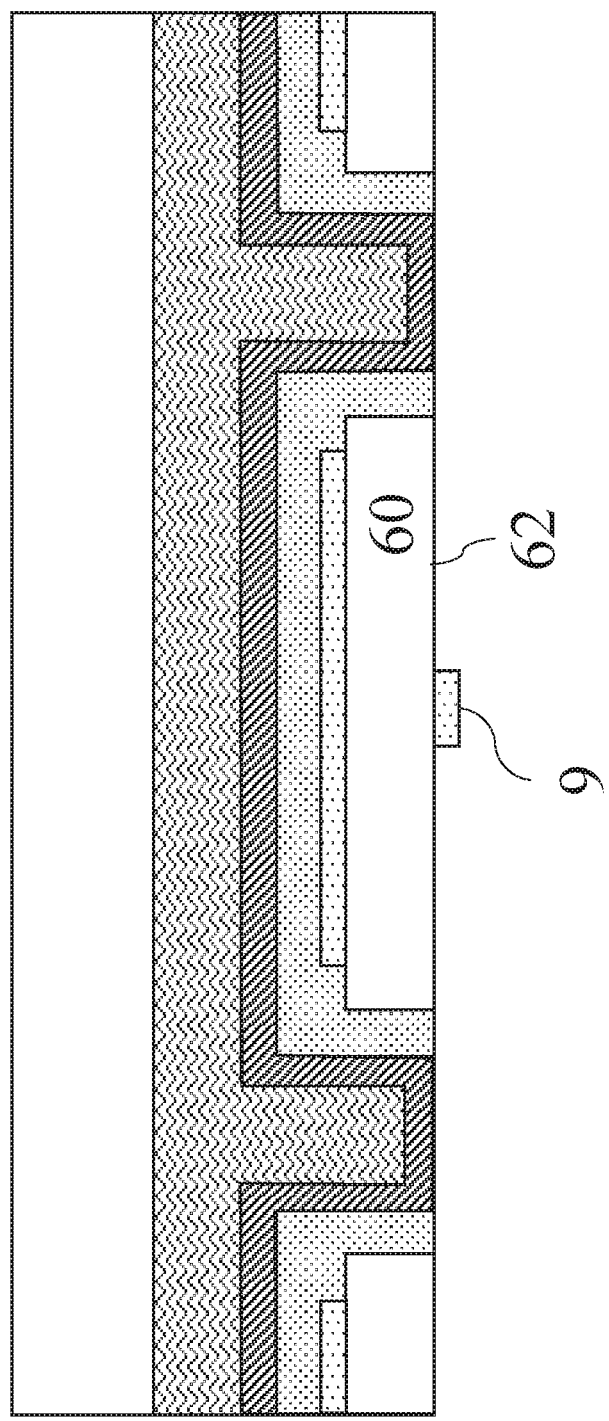

After the wafer substrate 1 (source substrate) is removed from the semiconductor element 60, a second electrical contact 9 is formed in step 180 on the exposed substrate side 62 of the semiconductor element 60, as shown in FIG. 8. Similar photolithographic methods and materials can be used to form the second electrical contact 9 as are used to form the first electrical contact 3.

Figure 9:
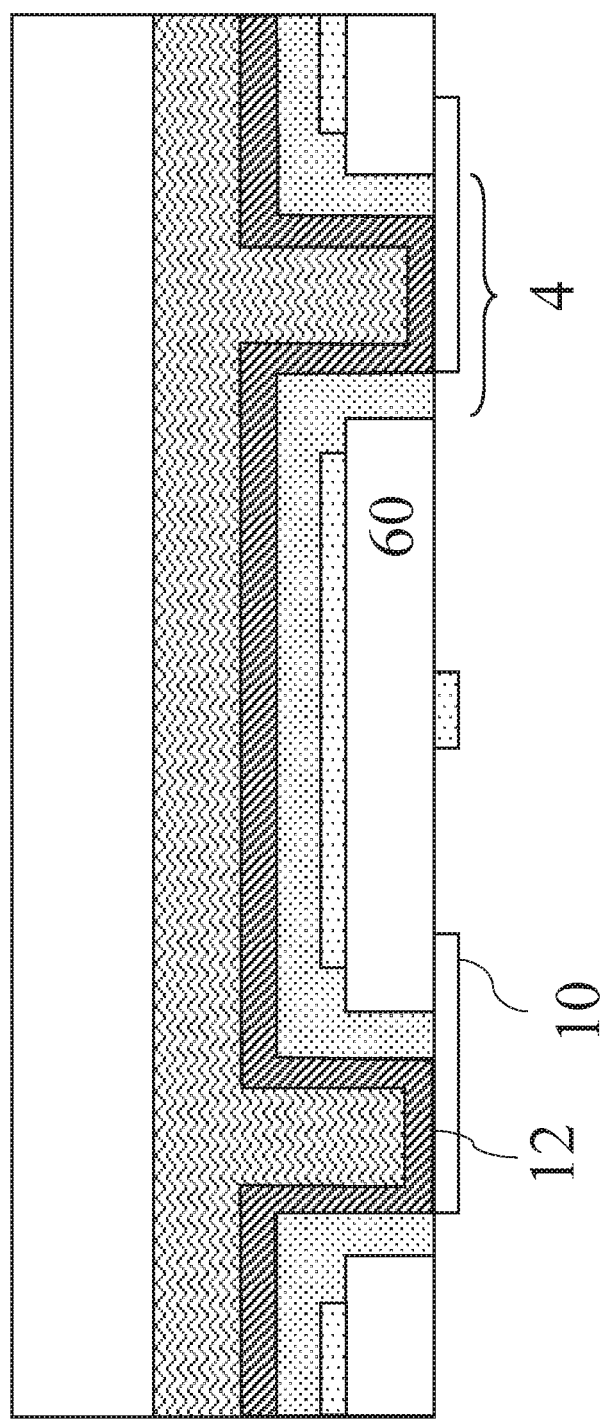

A tether 10 is formed (step 200) (e.g., across the trench 4) to bridge the semiconductor element 60 to the anchor 12 as shown in FIG. 9. The tether 10 can be made in a common step, a different step, before, or after the second electrical contact 9 is formed in step 180. The tether 10 is formed to connect the semiconductor element 60 to the anchor 12 such that the position and/or orientation of the semiconductor element 60 is maintained after the sacrificial layer 5 is removed.

Figure 10:
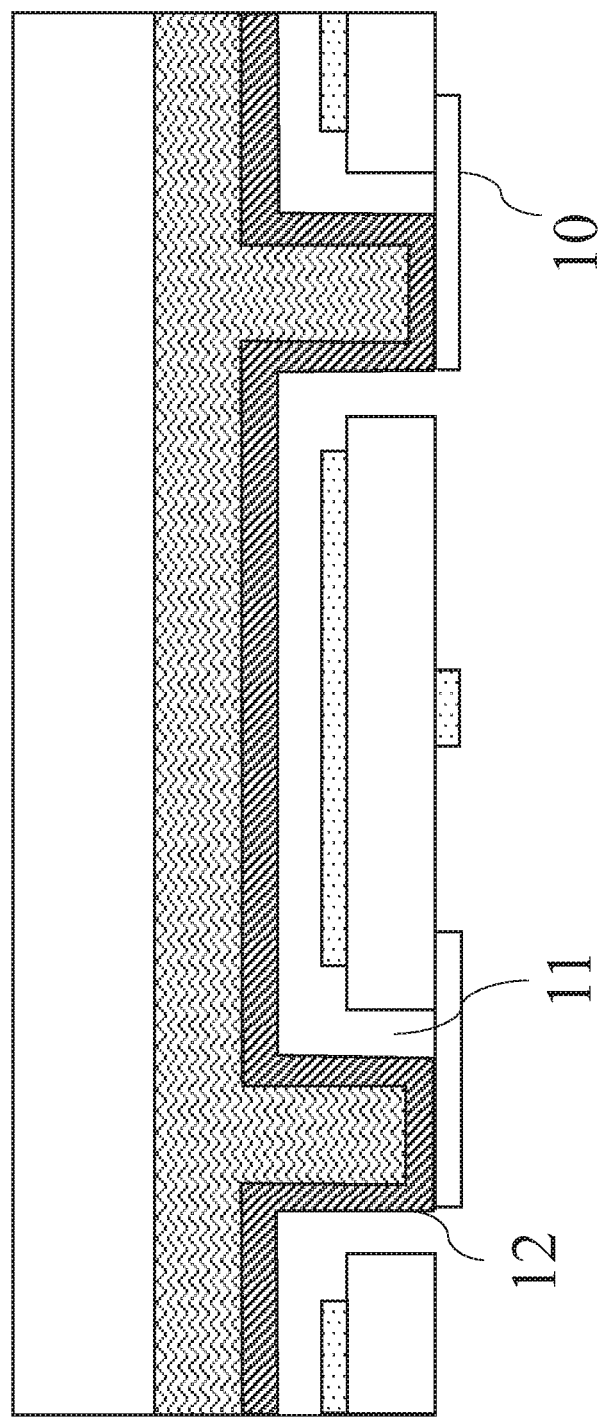
Figure 31:
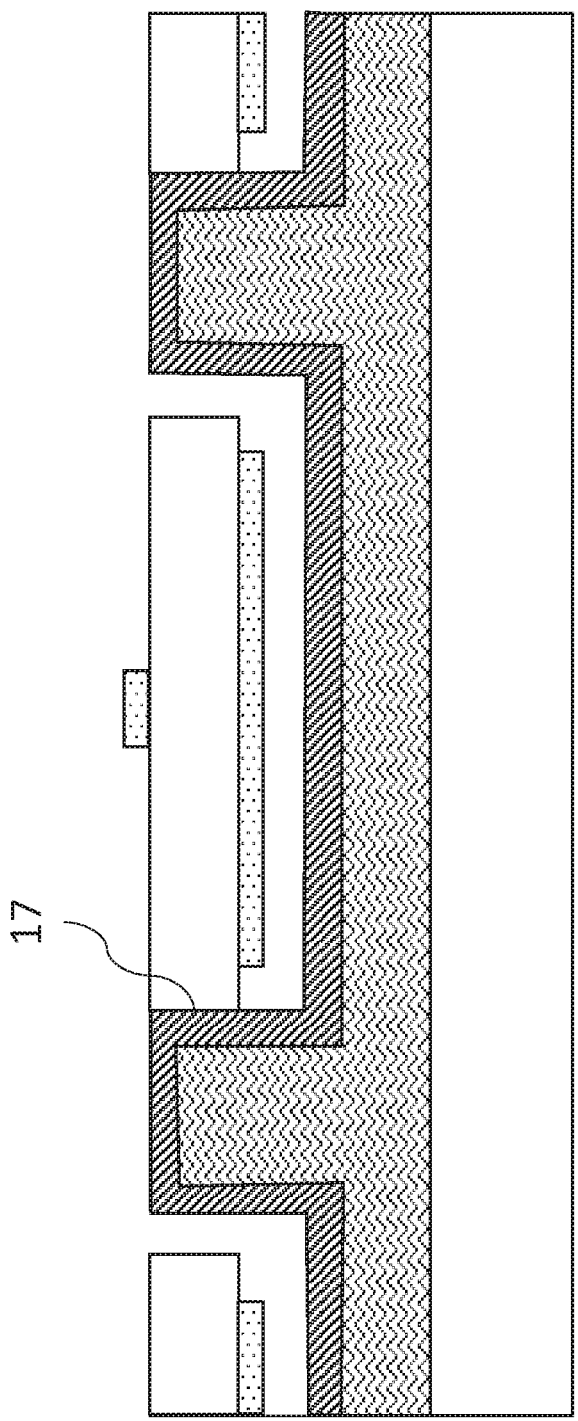

In step 200 and as shown in FIG. 10, the sacrificial layer 5 is removed to form a printable semiconductor structure, for example, an LED, a diode, or other semiconductor devices. Tether 10 tethers the printable semiconductor structure to the anchor 12 formed by the interlayer 6. This maintains the position of the printable semiconductor structure even though separation 11 now exists with the sacrificial layer 5 removed. The interlayer 6 has a different chemical selectivity than the sacrificial layer 5, thereby allowing removal of the sacrificial layer 5 without removing the interlayer 6. If the interlayer 6 forms the interlayer tether 17 (as shown in FIG. 30), the sacrificial layer 5 removal step 200 results in the structure illustrated in FIG. 31.

Figure 11:
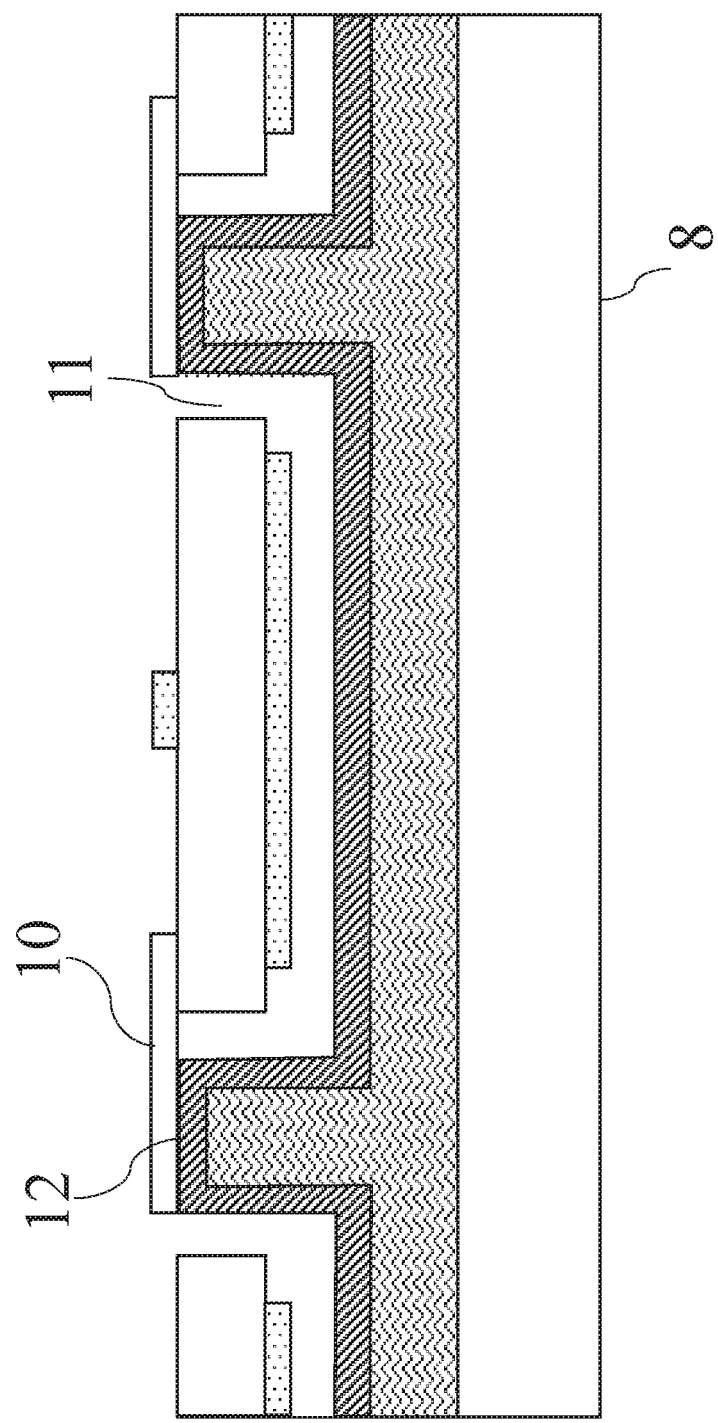
FIG. 11 is a cross section corresponding to an inverted view of the illustration of FIG. 10 in accordance with an embodiment of the present invention.

FIG. 11 illustrates the same structure as that of FIG. 10 but inverted and in a position to be printed using, for example, an elastomeric stamp. The micro transfer printing process described in U.S. Pat. Nos. 7,622,367 and 8,506,867, each of which is hereby incorporated by reference in its entirety.

Figure 12:
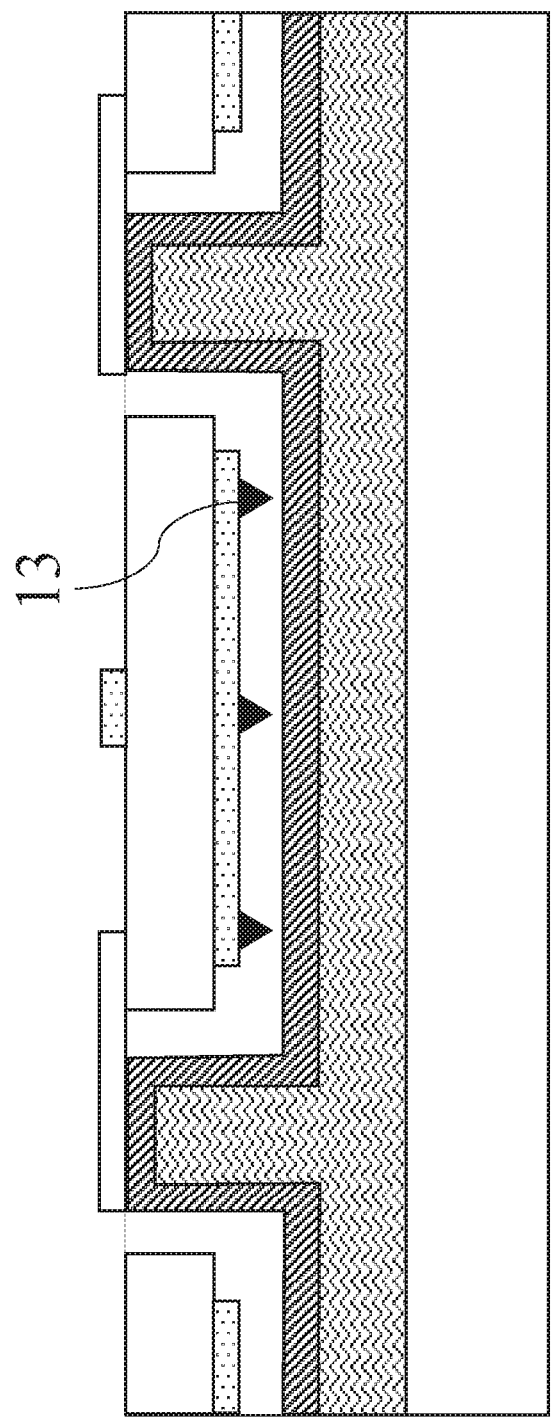
FIG. 12 is a cross section illustrating conductive protrusions in accordance with an embodiment of the present invention.
Figure 19:
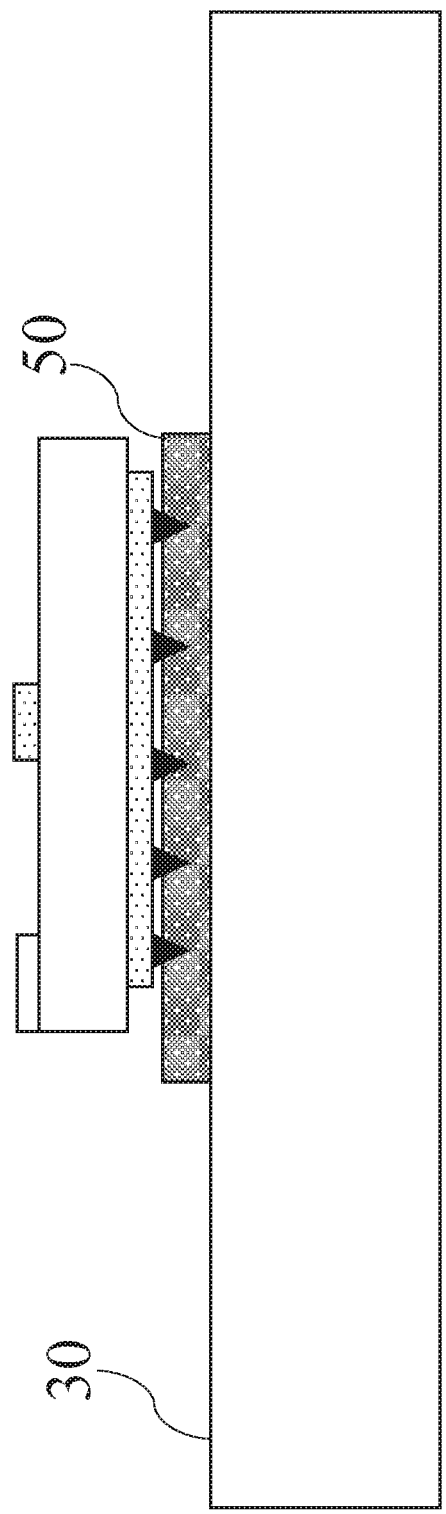
FIG. 19 is a cross section illustrating conductive protrusions making electrical contact with an electrical conductor on a destination substrate in accordance with an embodiment of the present invention.

Referring to FIG. 12 and FIG. 24, in a further embodiment of the present invention, one or more protrusions 13 are formed on the first electrical contact 3 in step 125. The protrusions 13, for example, may be electrically conductive protrusions 13. When the semiconductor structure is printed onto a destination substrate 30, as shown in FIG. 19, the conductive protrusions 13 assist in providing electrical contact between the first electrical contact 3 and a first wire 50 formed on the destination substrate 30 formed on the destination substrate 30. In some embodiments, the protrusions 13 are made of a harder conductive material than the wire 50 such that the protrusions 13 penetrate the wire 50 when the semiconductor structure is printed. In some embodiments, the structure (e.g., thickness and/or shape) of the protrusions 13 and the wire 50 allow protrusions 13 to penetrate the wire 50 (or connection pad) when the semiconductor structure is printed.

In some embodiments as illustrated in FIGS. 10, 11, and 19, the first electrical contact 3 is on an opposite side of the semiconductor element 60 from the second electrical contact 9. In some embodiments, it is advantageous to have the first electrical contact 3 and the second electronic accessible from the same side of the semiconductor element. This may be accomplished in several ways.

Figure 13:
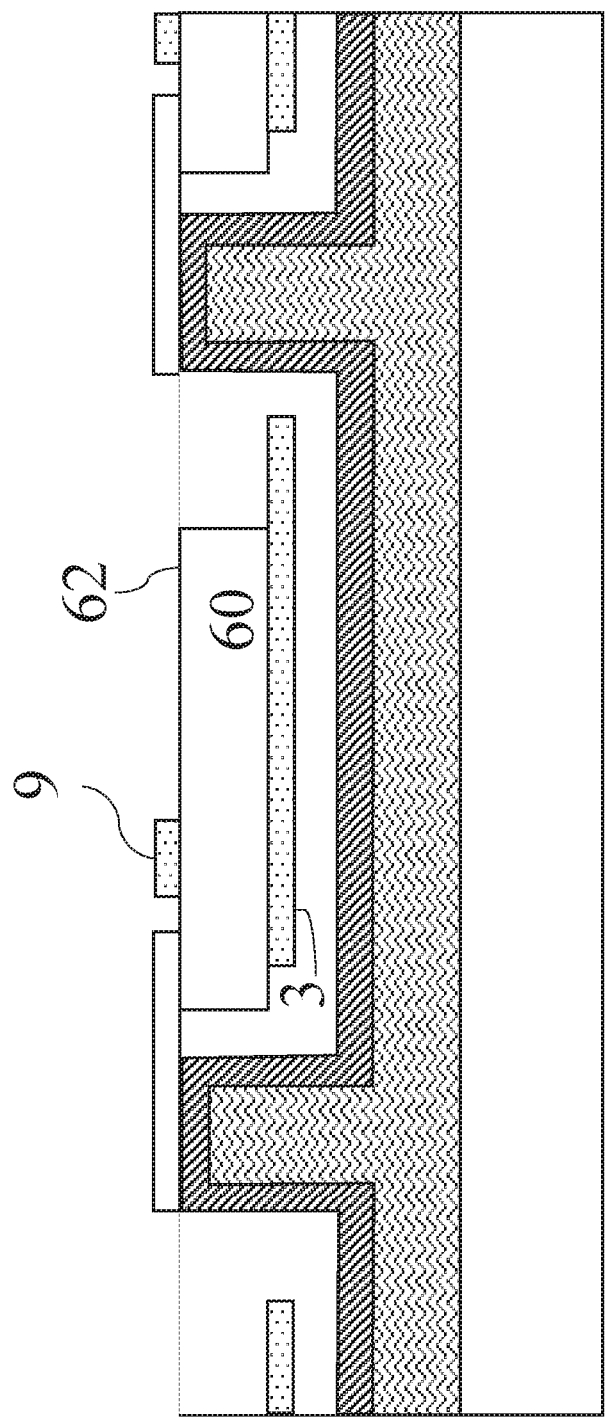
FIG. 13 is a cross section of an embodiment of the present invention having exposed first and second electrical electrodes.
Figure 20:
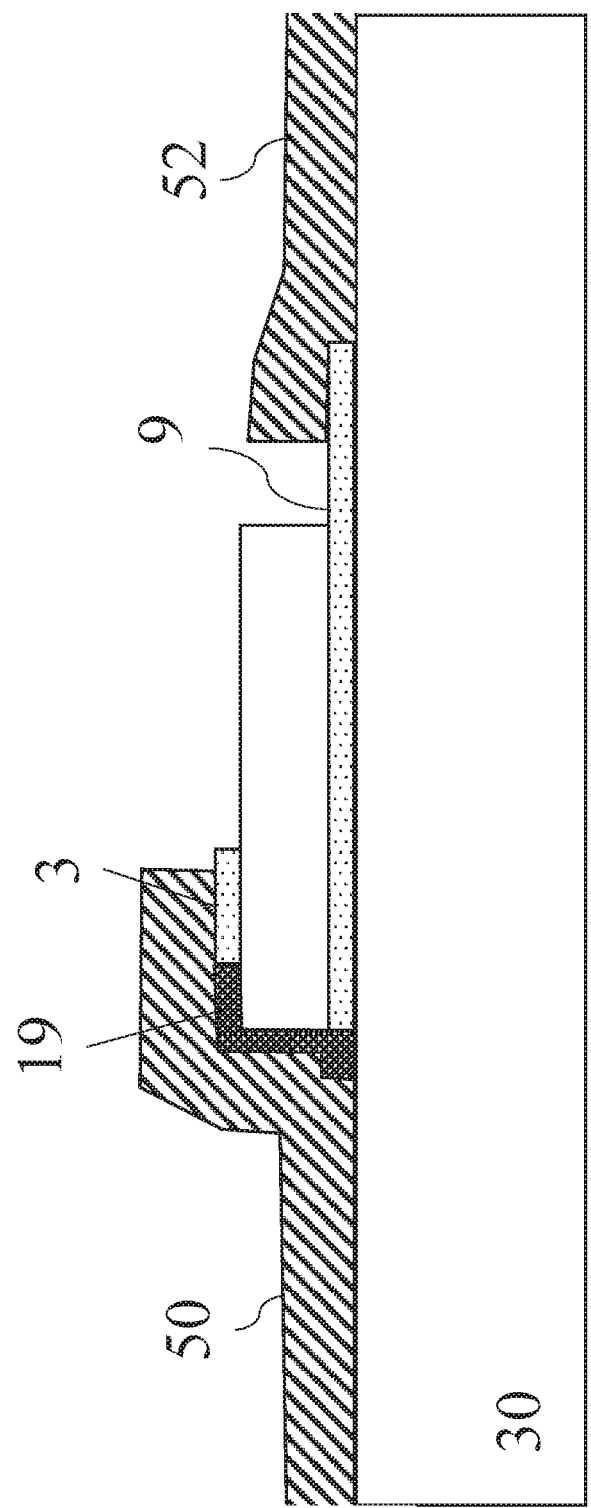
FIG. 20 and FIG. 21 are cross sections illustrating various arrangements of electrical contacts and semiconductor elements in accordance with embodiments of the present invention.

Referring next to FIG. 13, the first electrical contact 3 is on the handle side 64 of the semiconductor element 60 and the second electrical contact 9 is on the opposite substrate side 62 of the semiconductor element 60. In this example, the first electrical contract 3 is accessible from the top (as shown in FIG. 13) when the semiconductor element 60 is printed to the destination substrate. The first electrical contract 3 is formed such that a portion of it extends beyond the edge of the semiconductor element 60, thereby enabling access to the first electrical contact 3 from the same side of the structure as the second electrical contact 9 when the structure is printed to a destination substrate 30. This may be advantageous as printed on a destination substrate 30, both the first and second electrical contacts 3, 9 are accessible for connection in a common set of photolithographic steps, as shown in FIG. 20. A further description of micro-LEDs with two or more electrodes accessible for a common set of photolithographic steps, the technology of which may be applied to other devices as well, is discussed in U.S. Patent No. 62/056,419, filed Sep. 26, 2014, entitled Interconnection Architectures Advantageous for Micro-LED Displays Assembled Via Micro Transfer Printing, which is hereby incorporated by reference in its entirety.

As illustrated in FIG. 23, the structure illustrated in FIG. 13 may formed by removing a portion of the semiconductor element 60 in step 175 (e.g., by etching) such that a portion of the first electrical contact 3 is exposed (e.g., accessible from the same side as the second electrical contact 9) as shown in FIG. 13 using photolithographic processes. This may be accomplished after removing the wafer substrate 1 in step 170.

Figure 14:
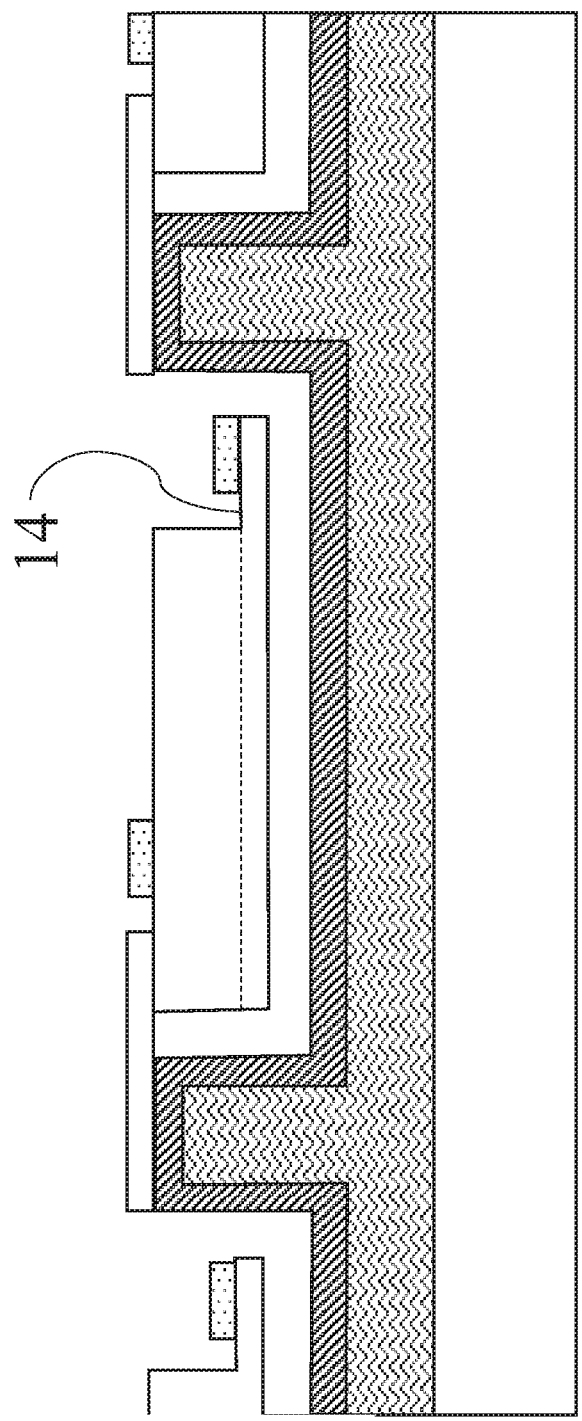
FIG. 14 is a cross section of an embodiment of the present invention having exposed first and second electrodes.
Figure 25:
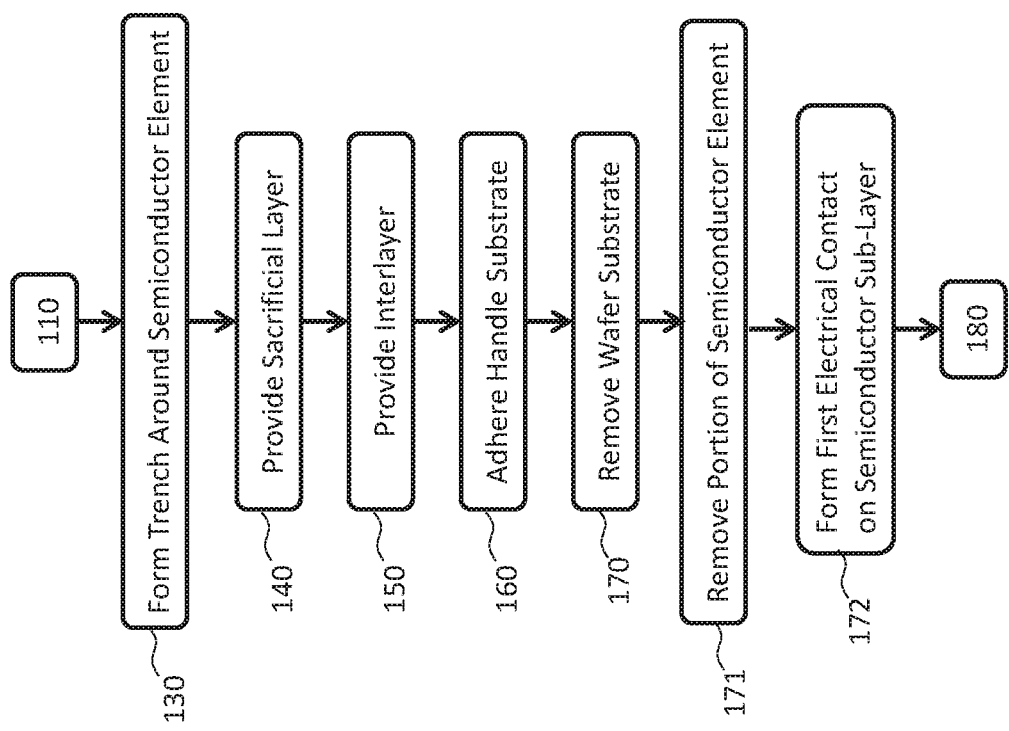

Referring next to FIG. 14, an alternative structure locates both the first and second electrical contacts 3, 9 on the substrate side 62 of the semiconductor element 60. This structure is also made by removing a portion of the semiconductor element 60 in step 175, however, the removal of semiconductor material is stopped before the portion is etched entirely through the semiconductor element 60, thereby leaving a cantilever extension 14 of the semiconductor element 60. In one embodiment, the cantilever extension 14 is doped differently from the remainder of the semiconductor element 60. This, for example, allows the cantilever extension 14 to be more electrically conductive or to better prevent light emission while the remainder of the semiconductor element 60 is doped to emit light in response to a current between the first and second electrical contacts 3, 9. After the cantilever extension 14 is formed, the second electrical contact 9 is formed on the cantilever extension 14 (e.g., by a photolithography). Referring to FIG. 25, in some embodiments, the structure of FIG. 14 is formed by using the process of FIG. 22 but skipping the step 120 of forming the first electrical contact 3 on the handle side 64 of the semiconductor structure 60. The process then continues as described with respect to FIG. 22 until after the wafer substrate 1 is removed in step 170. After the wafer substrate 1 is removed, the portion of the semiconductor element 60 is removed in step 171, forming the cantilever extension 14, and the first electrical contact 3 is formed on the cantilever extension 14 in step 172. In some embodiments, both the first and second electrical contracts 3, 9 are formed at the same time or one after the other.

Figure 26:
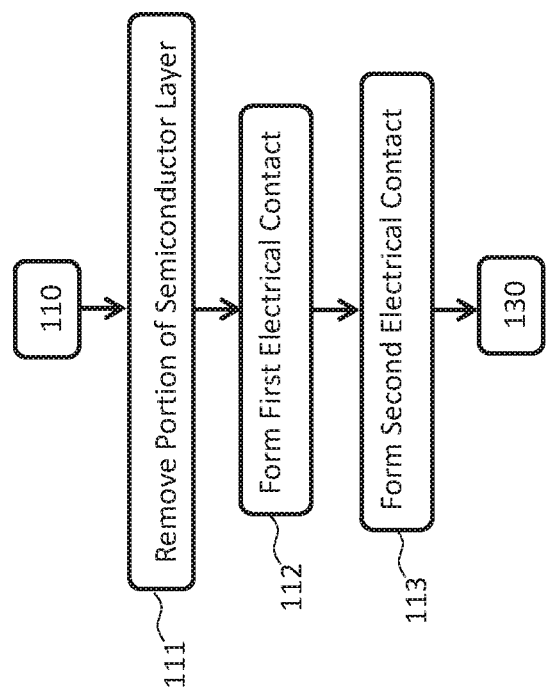

The process of FIG. 25 forms the structure of FIG. 14 with the first and second electrical contacts 3, 9 on the substrate side 62 of the semiconductor element 60. In an alternative embodiment and method illustrated in FIG. 15 and FIG. 26, the first and second electrical contacts 3, 9 are formed on the handle side 64 of the semiconductor element 60. In this embodiment, as illustrated in FIG. 26, after the semiconductor layer 2 is formed (step 110), a portion is removed of the semiconductor layer 2 in step 111 to form the cantilever extension 14. The first electrical contact 3 is then formed on the semiconductor layer 2 in step 112 and the second electrical contact 9 is formed on the cantilever extension 14 in step 113. The printable semiconductor element shown in FIG. 15 may be printed with the first and second electrical contacts 3, 9 facing the destination substrate 30 or facing away from the destination substrate 30. Various techniques may be used to flip the printable structures, such as those described in U.S. Pat. No. 8,889,485, issued Nov. 18, 2014, entitled Methods for Surface Attachment of Flipped Active Components, which is hereby incorporated by reference in its entirety.

Figure 15:
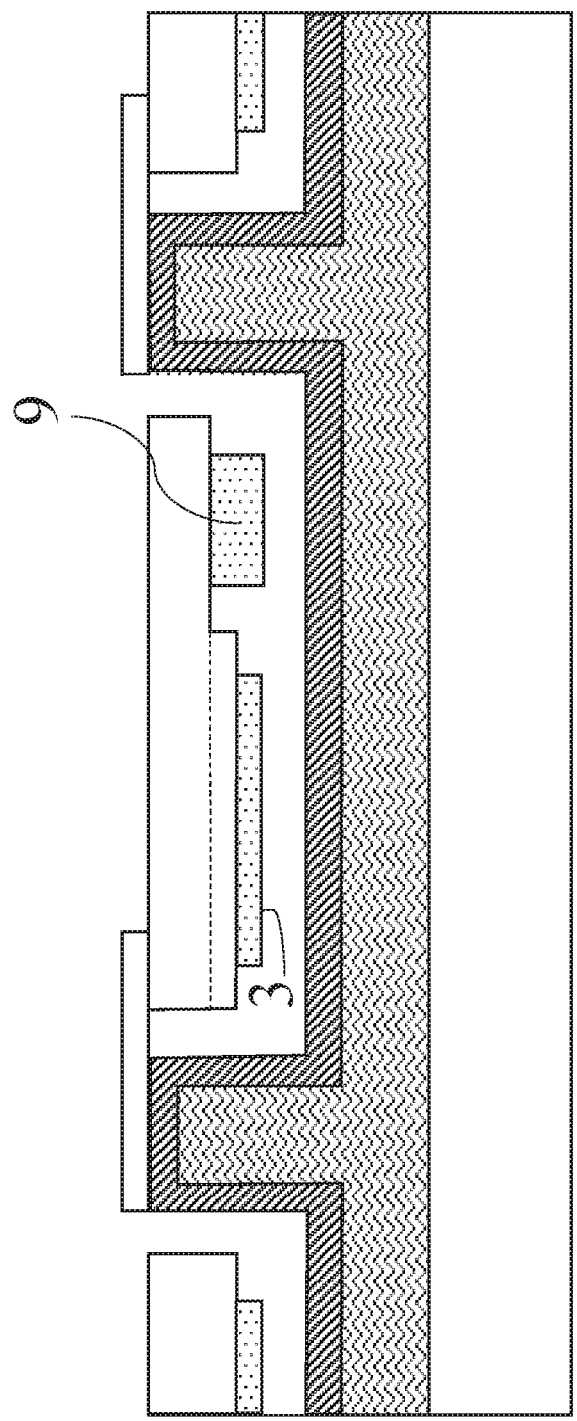
FIG. 15 is a cross section of an embodiment of the present invention having first and second electrodes exposed to a similar side of the semiconductor element.
Figure 21:
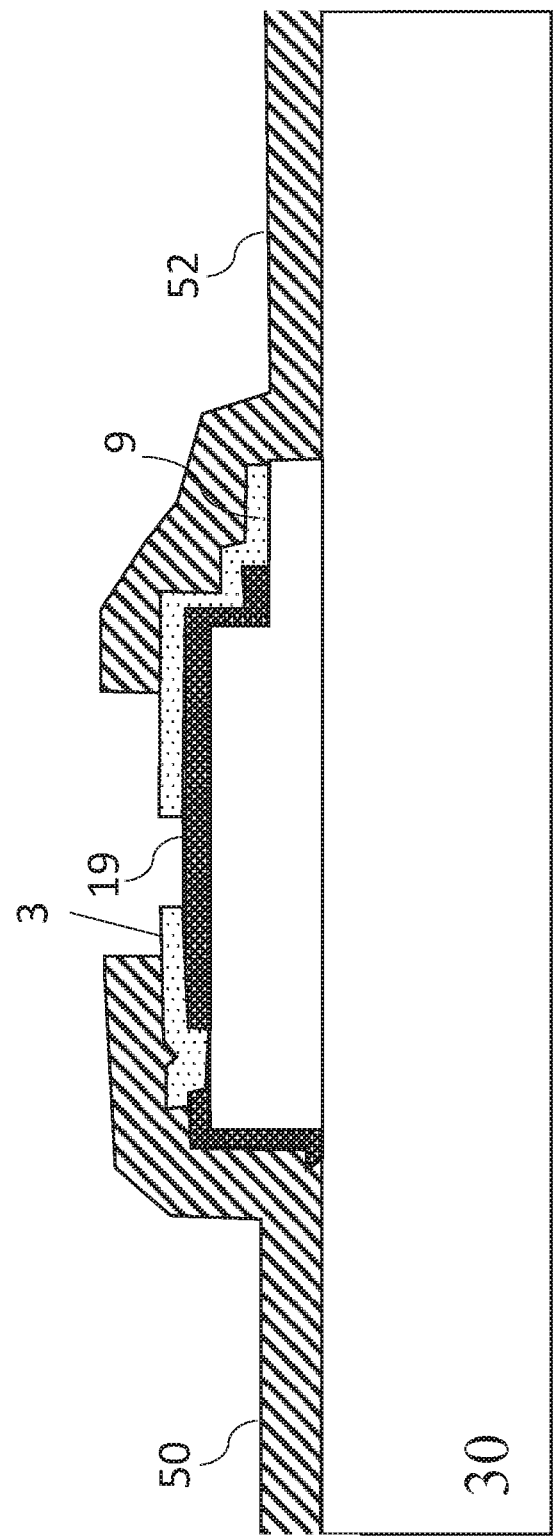

The structures of FIGS. 14 and 15 may be printed on a destination substrate 30 using a printing process employing a stamp, such as an elastomeric stamp to form the structures, such as the structure illustrated in FIG. 21. Referring to FIG. 16 a stamp 20 includes a stamp substrate 23 and a stamp post 24. The stamp posts 24 are pressed against the semiconductor structures of the present invention to fracture the tethers 10 to form fractured tethers 25 and release the semiconductor structures. The semiconductor structures then adhere to the stamp posts 24, as shown in FIG. 16. The semiconductor structures are then printed to a destination substrate 30.

Figure 17:
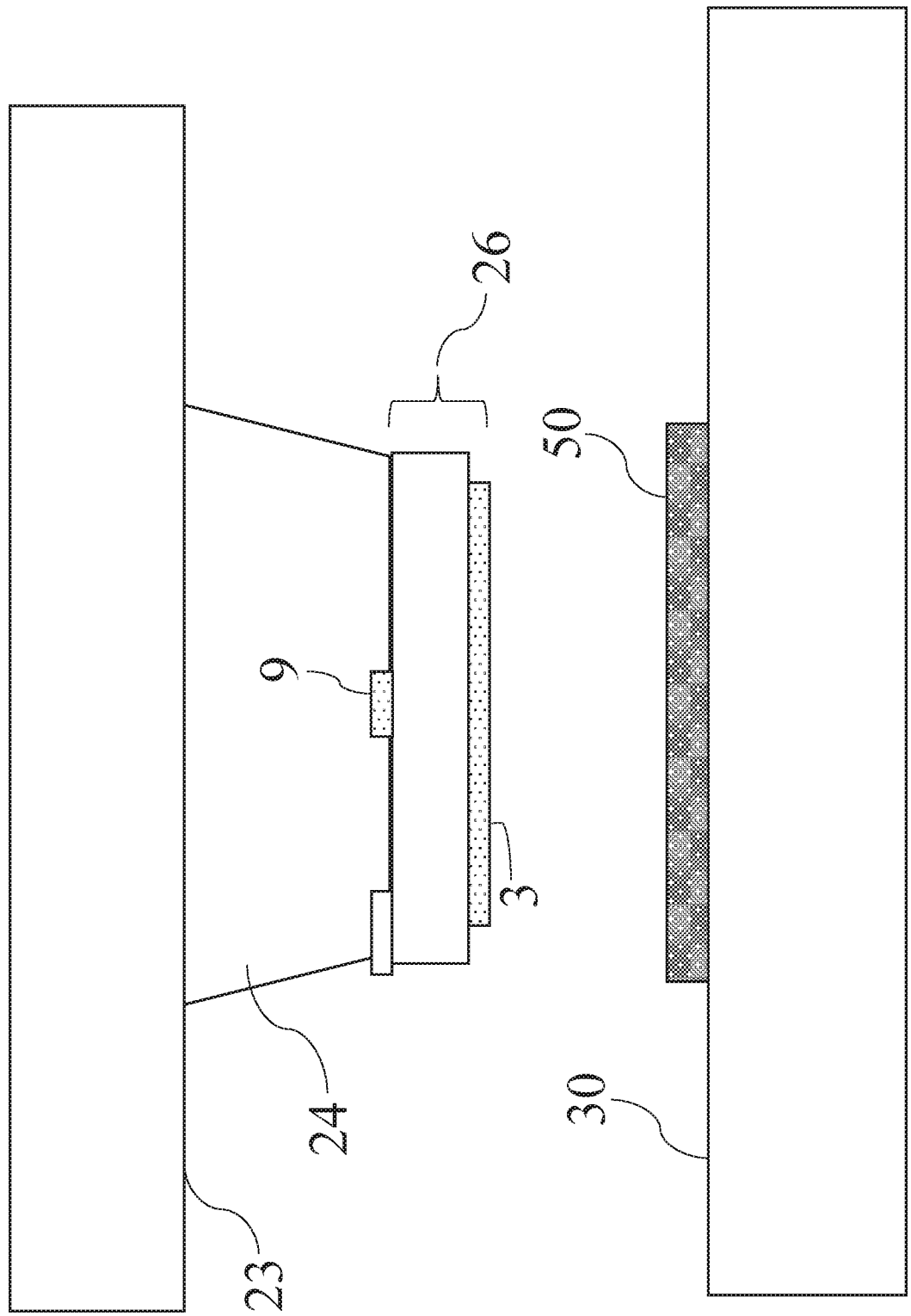
Figure 18:
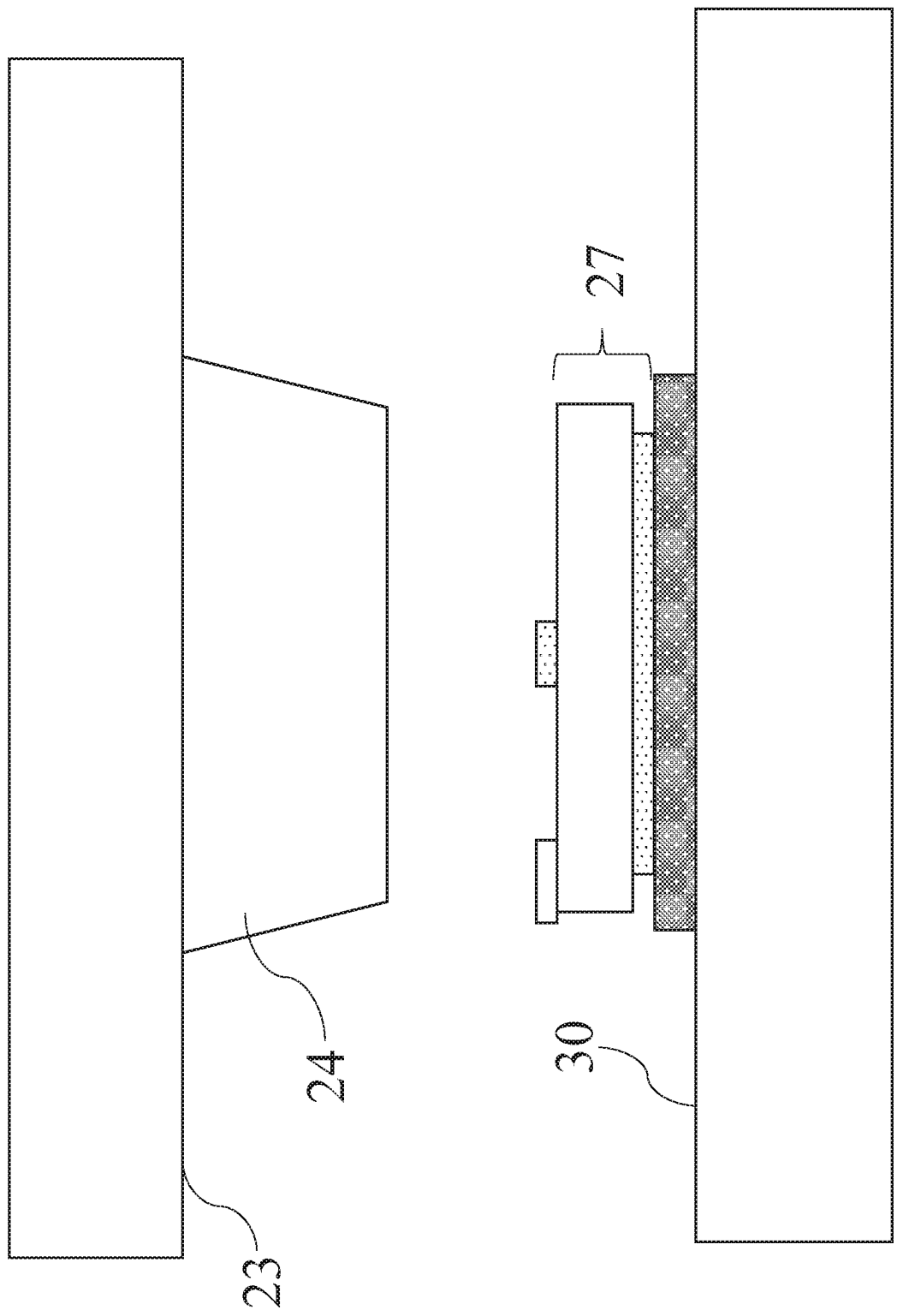

In some embodiments, as shown in FIG. 17, the picked up semiconductor structure 26 is the positioned over the destination substrate 30 with the first electrical contact 3 aligned with the first contact pad 50 on the destination substrate 30. The picked up semiconductor structure 26 is then transferred to the destination substrate 30 with the first electrical contact 3 in contact with the first contact pad 50 on the destination substrate 30, as shown in FIG. 18. An electrical connection may be made to the second electrical contact 9 of the printed semiconductor structure 27. Further discussion of methods of micro transfer printing can be found in U.S. Pat. Nos. 7,622,367 and 8,506,867, each of which is hereby incorporated by reference in its entirety.

In some embodiments, the picked up semiconductor structure 26 may be assembled on the destination substrate 30 using compound micro assembly as explained in U.S. patent application Ser. No. 62/055,472, filed Sep. 25, 2014, entitled Compound Micro-Assembly Strategies and Devices, which is hereby incorporated by reference in its entirety.

Figure 27:
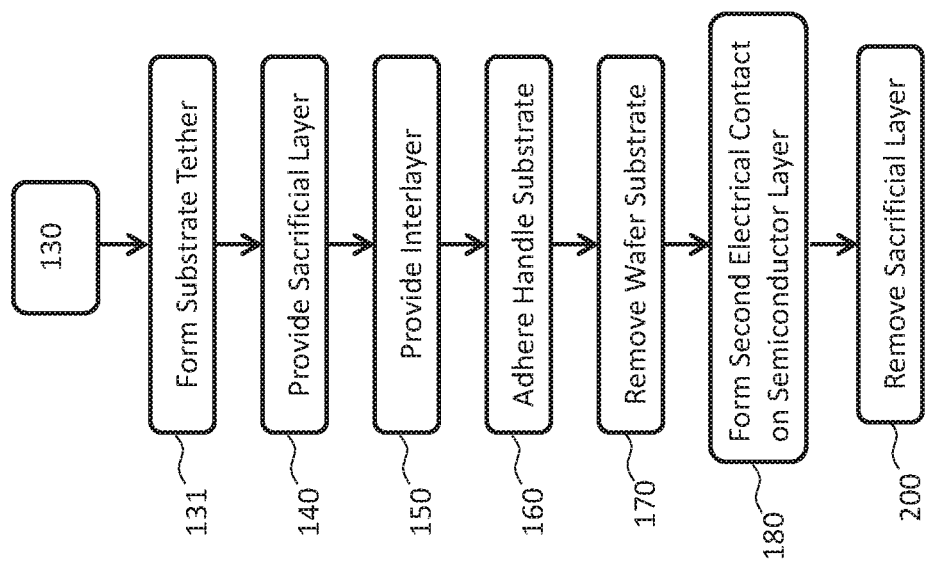
Figure 28:
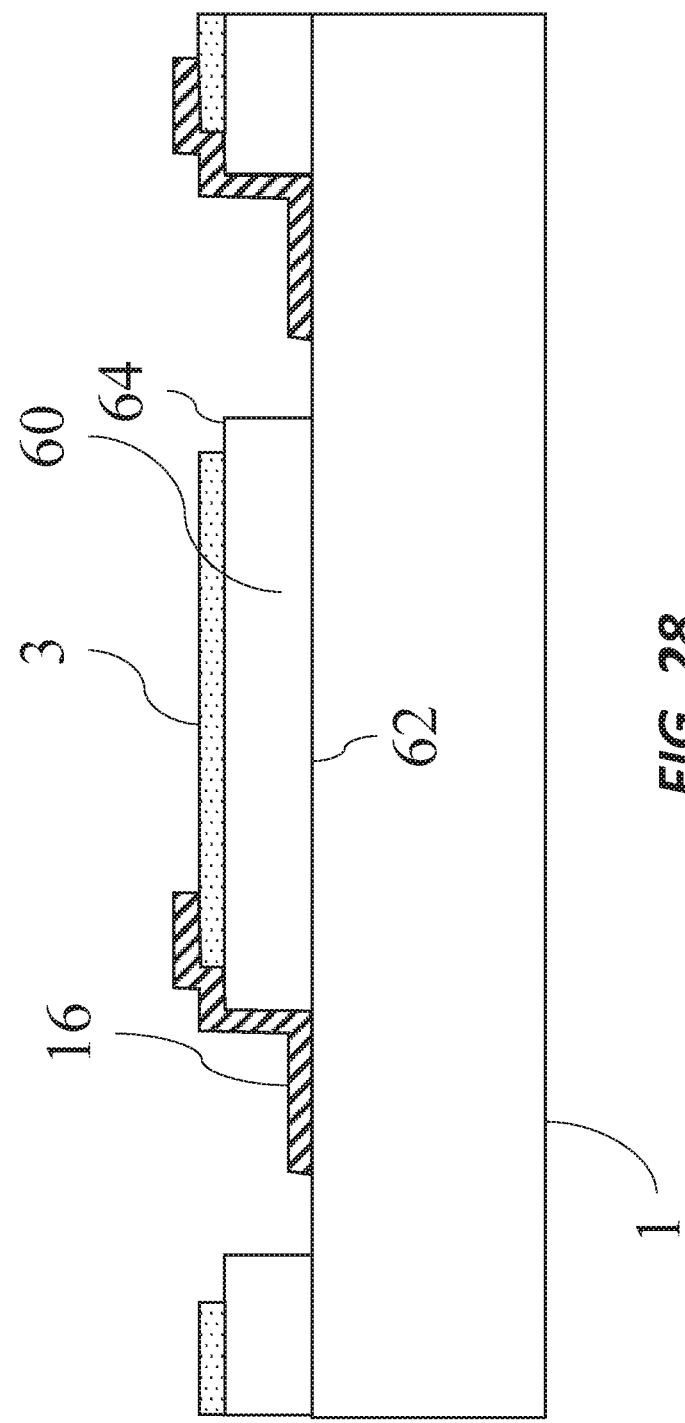
FIGS. 28-29 are cross sections illustrating structures having substrate tethers in accordance with embodiments of the present invention.
Figure 29:
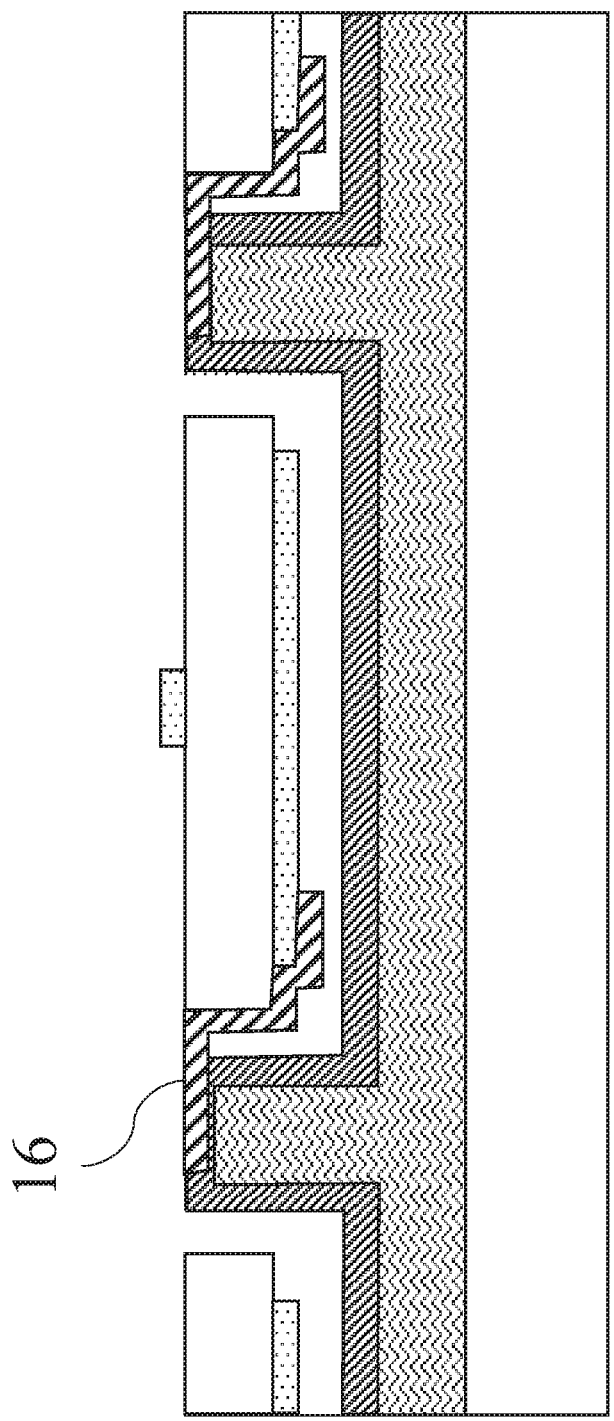

Referring next to FIGS. 27 and 28, in an embodiment of the present invention the tethers are formed as substrate tethers 16 on the wafer substrate 1 in step 131 after the semiconductor element 60 and the first electrical contact 3 are formed. The sacrificial layer 5 and the interlayer 6 are then formed as described above in steps 140 and 150. The interlayer 6 is adhered to the handle substrate 8 in step 160 and the wafer substrate 1 is removed in step 170. The second electrical contact 9 is then formed on the semiconductor element 60 in step 180 and the sacrificial layer 5 removed to form the structure shown in FIG. 29.

Figure 34:
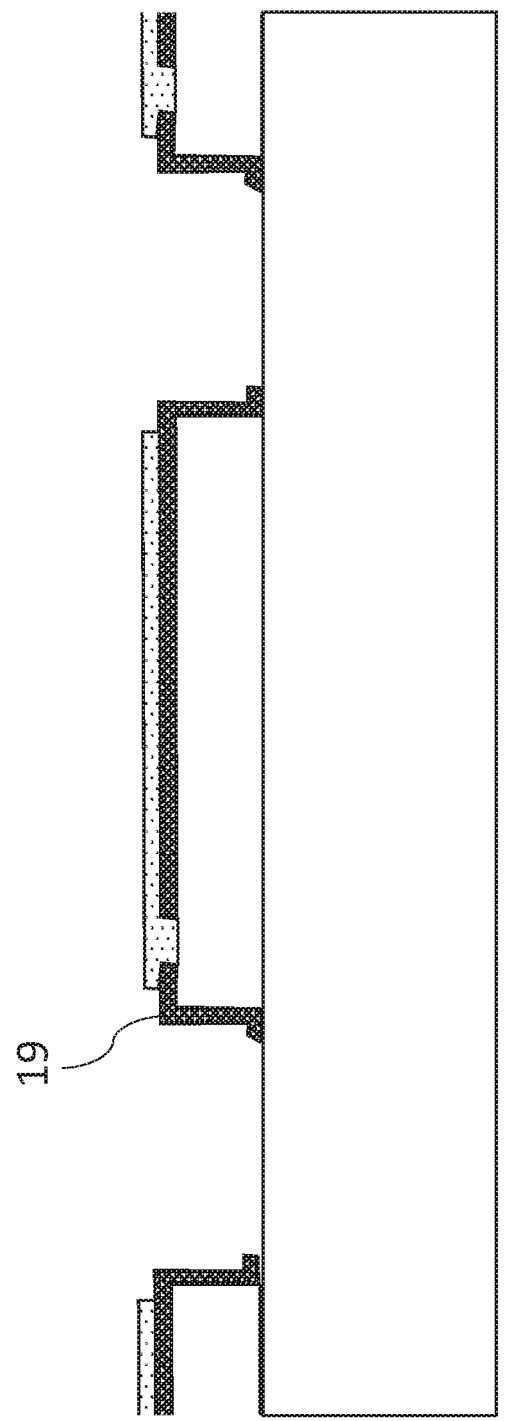
FIGS. 34-35 are cross sections illustrating structures having passivation layers in accordance with embodiments of the present invention.
Figure 35:
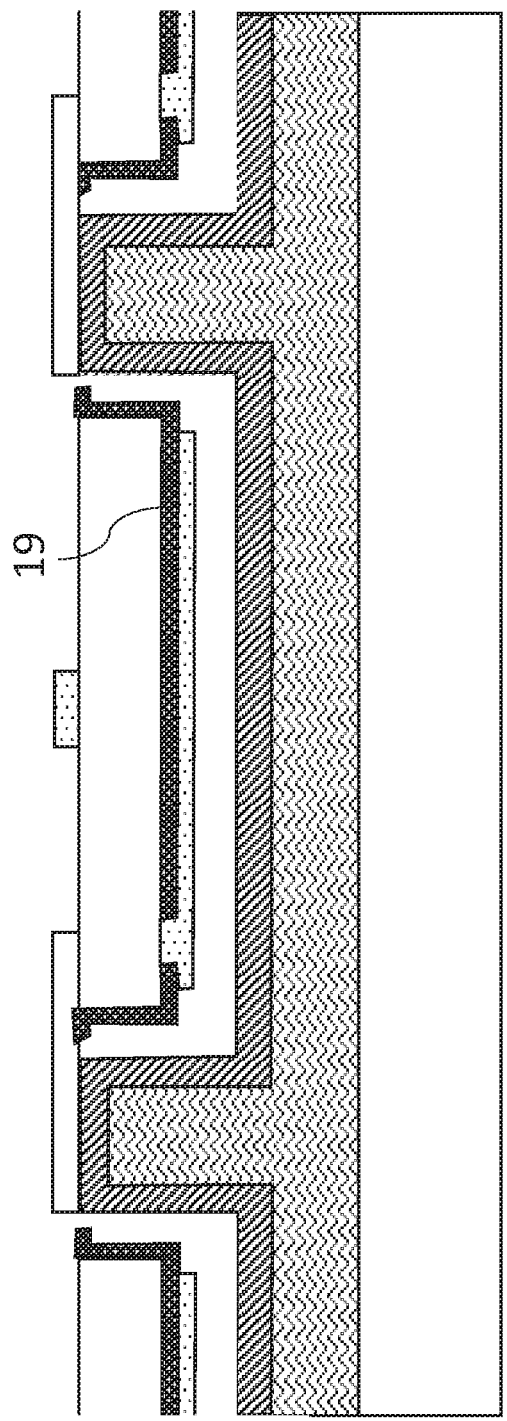

In a further embodiment and as shown in FIG. 34, a passivation layer 19 is provided on a portion of the handle side 64 of the semiconductor element 60. The passivation layer 19 electrically isolates the side walls of the side of the semiconductor element 60 avoid unwanted electrical conduction when the first or second electrical contacts are electrically connected on a destination substrate 30. FIG. 35 illustrates a printable semiconductor structure with the passivation layer 19.

In a further embodiment and as also illustrated in FIG. 21, a second wire 52 is formed on the destination substrate 30 and is electrically connected to the second electrical contact 9. Both the first and the second electrical contacts 3, 9 can be made in a common step if both are on a common side of the semiconductor element 60 opposite the destination substrate 30 after printing. Using a common step to electrically connect the first and the second electrical contacts 3, 9 to the first and second wires 50, 52, respectively, on the destination substrate 30 reduces costs and improves yields. The passivation layer 19 prevents unwanted electrical conduction to the semiconductor element 60 from the first and second wires 50, 52.

In an embodiment of the present invention, the semiconductor element 60 has a length greater than its width, for example having an aspect ratio greater than or equal to 2, 4, 8, 10, 20, or 50, and first and second electrical contacts 3, 9 that are adjacent to the ends of the semiconductor element 60 along the length of the semiconductor element 60. This structure enables low-precision manufacturing processes to electrically connect the first and second wires 50, 52 to the first and second electrical contacts 3, 9 without creating registration problems and possible unwanted electrical shorts or opens.

At times the present disclosure describes formation of a single semiconductor element or structure (e.g., a micro-device). The same techniques and methods may be used to form arrays of these elements, devices, and/or structures such that multiple micro-devices may be micro transfer printed to a destination substrate from a single substrate (e.g., handle substrate). Thus, the present disclosure contemplates the formation and micro transfer printing of arrays of micro-devices using the methods and techniques described herein. When formation of a single structure is described herein, it is contemplated that the same steps may be performed to an array of structures at the same time, thereby enabling the formation of arrays of micro-devices for micro transfer printing to a destination substrate. For example, micro LEDs can be formed on their native substrate with a resolution of approximately 3000 micro LEDs per square inch (e.g., 2500-3100, 2900-3500 micro LEDs per square inch).

As is understood by those skilled in the art, the terms "over", "under", "above", "below", or "beneath" are relative terms and can be interchanged in reference to different orientations of the layers, elements, and substrates included in the present invention.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

What is claimed:

1. A printable inorganic semiconductor structure comprising:
   a handle substrate;
   an interlayer adhered to the handle substrate and forming an anchor;
   a sacrificial layer disposed on or over portions of the interlayer adjacent to the anchor, the interlayer having a different chemical selectivity than the sacrificial layer;
   a semiconductor layer disposed on or over at least portions of the sacrificial layer; and
   a semiconductor element made from at least the semiconductor layer, the semiconductor element having an exposed substrate side and a handle side opposite the exposed substrate side adjacent to the sacrificial layer, wherein the semiconductor element comprises a first electrical contact on the semiconductor layer, a cantilever extension comprising a portion of the semiconductor layer, and a second electrical contact on the cantilever extension,
   wherein the sacrificial layer covers the first and second electrical contacts, the sacrificial layer covers at least a portion of the handle side of the semiconductor element, and a portion of the sacrificial layer is exposed.

2. The printable inorganic semiconductor structure of claim 1, comprising a tether bridging the exposed substrate side of the semiconductor element to the anchor.

3. The printable inorganic semiconductor structure of claim 2, wherein the tether is disposed partially on or over the anchor and partially on or over the semiconductor element.

4. The printable inorganic semiconductor structure of claim 2, wherein the interlayer forms the tether.

5. The printable inorganic semiconductor structure of claim 1, wherein the first and second electrical contacts are disposed on the handle side.

6. The printable inorganic semiconductor structure of claim 1, wherein the first and second electrical contacts are disposed on the substrate side.

7. The printable inorganic semiconductor element of claim 1, wherein the semiconductor element is surrounded by a trench.

8. The printable inorganic semiconductor element of claim 1, wherein the anchor is laterally adjacent to the semiconductor element with respect to the handle substrate.

9. The printable inorganic semiconductor structure of claim 1, wherein the semiconductor element is an integrated circuit.

10. The printable inorganic semiconductor structure of claim 1, wherein the semiconductor element is a light-emitting diode or a laser.

11. The printable inorganic semiconductor structure of claim 1, wherein the semiconductor layer comprises one or more of GaN and doped GaN.

12. The printable inorganic semiconductor structure of claim 1, wherein the interlayer comprises an adhesion layer.

13. The printable inorganic semiconductor structure of claim 1, comprising one or more protrusions disposed on the first electrical contact.

14. The printable inorganic semiconductor structure of claim 1, wherein the first electrical contact and the second electrical contact have a same thickness.

15. The printable inorganic semiconductor structure of claim 1, wherein the first electrical contact has a different thickness than the second electrical contact.

16. The printable inorganic semiconductor structure of claim 1, wherein the first electrical contact and the second electrical contact extend to a common distance from a surface of the semiconductor element.

17. The printable inorganic semiconductor structure of claim 1, wherein the semiconductor structure has at least one of a width from 1-8 µm, a length from 5-10 µm, and a height from 0.5-3 µm.

18. The printable inorganic semiconductor structure of claim 1, wherein the interlayer forms a plurality of anchors separating a plurality of semiconductor elements, each of the plurality of semiconductor elements physically secured to an anchor of the plurality of anchors.

19. A printable inorganic semiconductor structure comprising:
a handle substrate;
an interlayer adhered to the handle substrate and forming an anchor;
a semiconductor layer disposed over at least portions of the interlayer; and
a semiconductor element made from at least a semiconductor layer, the semiconductor element having an exposed substrate side and a handle side opposite the exposed substrate side adjacent to the sacrificial layer, wherein the semiconductor element comprises a first electrical contact on the semiconductor layer, a cantilever extension comprising a portion of the semiconductor layer, and a second electrical contact on the cantilever extension,
wherein the semiconductor element is adjacent to the anchor and a physical separation exists between the semiconductor element and the interlayer.

20. The printable inorganic semiconductor element of claim 19, wherein the semiconductor element is partially released from the handle substrate and physically secured to the anchor by a tether.

* * * * *